(12) United States Patent
Lannon et al.

(10) Patent No.: US 7,568,942 B1
(45) Date of Patent: Aug. 4, 2009

(54) SLEEVE AND COUPLER FOR ELECTRONIC DEVICE

(75) Inventors: Michael G. Lannon, 14 Driftwood La., Orleans, MA (US) 02653; Mary Obana, Orleans, MA (US); Carl R. Spoeth, Jr., Bayonet Point, FL (US); Jeffrey A. Pearson, Plymouth, MA (US)

(73) Assignee: Michael G. Lannon, Orleans, MA (US)

( * ) Notice: Subject to any disclaimer, the term of this patent is extended or adjusted under 35 U.S.C. 154(b) by 0 days.

(21) Appl. No.: 12/069,126

(22) Filed: Feb. 7, 2008

Related U.S. Application Data

(60) Provisional application No. 60/899,900, filed on Feb. 7, 2007.

(51) Int. Cl.
*H01R 13/52* (2006.01)
(52) U.S. Cl. ........................ 439/521; 439/136
(58) Field of Classification Search ............. 439/135, 439/136, 149, 521
See application file for complete search history.

(56) References Cited

U.S. PATENT DOCUMENTS

| | | | | |
|---|---|---|---|---|
| 6,065,981 | A * | 5/2000 | Sopotnick et al. | 439/135 |
| 6,456,500 | B1 | 9/2002 | Chen | |
| 6,522,534 | B1 * | 2/2003 | Wu | 361/679.4 |
| 6,561,421 | B1 * | 5/2003 | Yu | 235/451 |
| 6,612,853 | B2 * | 9/2003 | Wu | 439/136 |
| 6,639,791 | B2 * | 10/2003 | Su | 361/679.33 |
| 6,676,422 | B1 * | 1/2004 | Baker et al. | 439/135 |
| D492,307 | S | 6/2004 | Aqqad et al. | |
| 6,744,634 | B2 * | 6/2004 | Yen | 361/752 |
| 6,758,689 | B1 * | 7/2004 | Bair et al. | 439/136 |
| 6,763,410 | B2 | 7/2004 | Yu | |
| D494,969 | S | 8/2004 | Lin | |
| 6,808,400 | B2 | 10/2004 | Tu | |
| 6,905,352 | B2 * | 6/2005 | Chao | 439/135 |
| 6,926,544 | B2 * | 8/2005 | Lee | 439/147 |
| 6,932,276 | B1 * | 8/2005 | Liu | 235/486 |
| 6,932,629 | B2 * | 8/2005 | Ikenoue | 439/138 |
| 6,999,322 | B1 * | 2/2006 | Lin | 361/752 |
| 7,146,667 | B2 * | 12/2006 | Elsener | 7/118 |
| 7,153,148 | B2 * | 12/2006 | Chen et al. | 439/141 |
| 7,165,998 | B2 * | 1/2007 | Lee et al. | 439/660 |

(Continued)

*Primary Examiner*—Ross N Gushi
(74) *Attorney, Agent, or Firm*—Fish & Richardson P.C.

(57) ABSTRACT

A sleeve is disclosed for engaging an electronic device. The electronic device includes a housing with a plug extending therefrom. The housing has an engaging surface and a housing support surface. The sleeve comprises a plug cap for receiving the plug. A housing cap includes a cavity for receiving the housing. An elastic tether extends between the plug cap and the housing cap for securing the plug cap to the housing cap. The elastic tether is deformable for providing a first length during the plug cap engaging the plug. The elastic tether is deformable for providing a second length during the plug cap displaced above the plug. The elastic tether being is deformable for providing a third length during said plug cap removed from the plug. A coupling is disclosed for joining an electronic device and a computer device. The coupling comprises a housing having a first end, a second end and a body. The body defines a contoured body cross section. A receptacle has an interior end, an exterior end and a wall surface. The wall surface defines a contoured wall cross section. The contoured body cross section is commensurate with the contoured wall cross section for inserting and keying the housing into the receptacle.

15 Claims, 25 Drawing Sheets

U.S. PATENT DOCUMENTS

| | | | |
|---|---|---|---|
| 7,214,075 B2 * | 5/2007 | He et al. | 439/135 |
| 7,220,137 B1 * | 5/2007 | Liu | 439/136 |
| 7,241,153 B2 * | 7/2007 | He et al. | 439/148 |
| 7,275,941 B1 * | 10/2007 | Bushby | 439/133 |
| 7,295,431 B2 * | 11/2007 | Chuang | 361/679.55 |
| 7,341,464 B2 * | 3/2008 | Cuellar et al. | 439/135 |
| 7,359,208 B2 * | 4/2008 | Ni | 361/752 |
| 7,416,424 B1 * | 8/2008 | Deckman | 439/135 |
| 7,442,077 B2 * | 10/2008 | Peress et al. | 439/505 |
| 7,500,858 B2 * | 3/2009 | Emerson et al. | 439/136 |
| 7,503,780 B1 * | 3/2009 | Huang | 439/135 |
| 2003/0137859 A1 * | 7/2003 | Sugawara | 365/51 |
| 2003/0207601 A1 * | 11/2003 | Adachi | 439/135 |
| 2003/0223286 A1 * | 12/2003 | Lee | 365/200 |
| 2004/0090751 A1 | 5/2004 | Choi et al. | |
| 2004/0212966 A1 | 10/2004 | Fisher et al. | |
| 2005/0009388 A1 | 1/2005 | Chao | |
| 2005/0182872 A1 * | 8/2005 | Shih | 710/62 |
| 2005/0277316 A1 * | 12/2005 | Cohen | 439/135 |
| 2006/0073717 A1 * | 4/2006 | Ng et al. | 439/131 |
| 2006/0094301 A1 * | 5/2006 | Lee et al. | 439/660 |
| 2006/0148287 A1 * | 7/2006 | Zahnen et al. | 439/135 |
| 2006/0234533 A1 * | 10/2006 | Lei et al. | 439/135 |
| 2006/0288169 A1 * | 12/2006 | Steiner | 711/115 |
| 2007/0037454 A1 * | 2/2007 | Bushby | 439/680 |
| 2007/0111583 A1 * | 5/2007 | Cuellar et al. | 439/353 |
| 2007/0161365 A1 * | 7/2007 | Chen | 455/347 |
| 2007/0231053 A1 * | 10/2007 | Chan | 401/195 |
| 2008/0144270 A1 * | 6/2008 | Dal Porto et al. | 361/684 |
| 2008/0150679 A1 * | 6/2008 | Bloomfield | 340/5.7 |
| 2008/0189486 A1 * | 8/2008 | Nguyen et al. | 711/115 |
| 2008/0218957 A1 * | 9/2008 | Kim | 361/684 |
| 2008/0232060 A1 * | 9/2008 | Yu et al. | 361/684 |
| 2008/0237237 A1 * | 10/2008 | Watson | 220/375 |
| 2008/0261449 A1 * | 10/2008 | Ni et al. | 439/607 |
| 2008/0276099 A1 * | 11/2008 | Nguyen et al. | 713/186 |
| 2008/0278902 A1 * | 11/2008 | Nguyen et al. | 361/684 |
| 2008/0288697 A1 * | 11/2008 | Kim | 710/300 |
| 2009/0042433 A1 * | 2/2009 | Bushby | 439/352 |

* cited by examiner

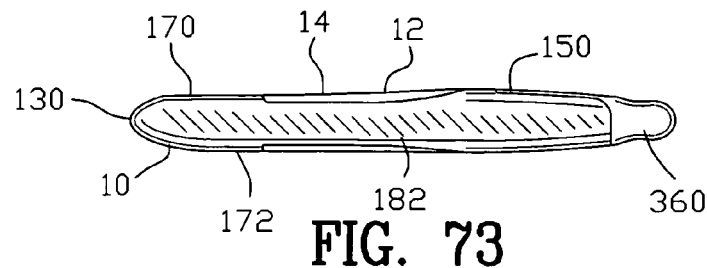
FIG. 73
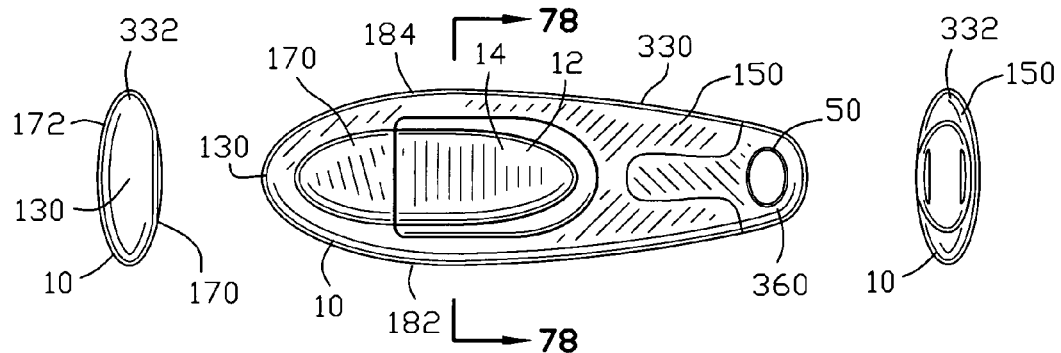
FIG. 74  FIG. 72  FIG. 75
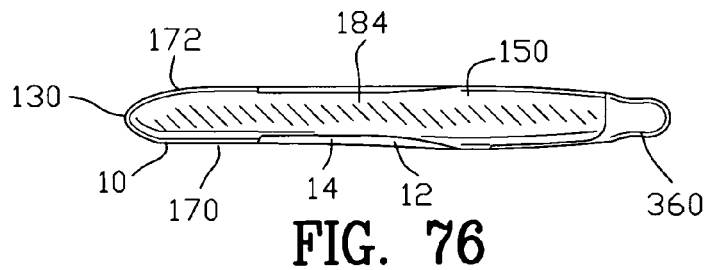
FIG. 76
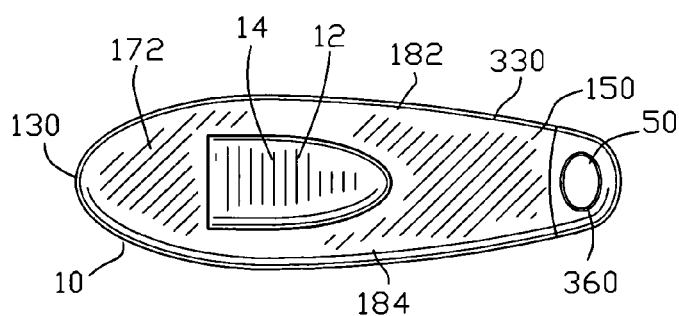 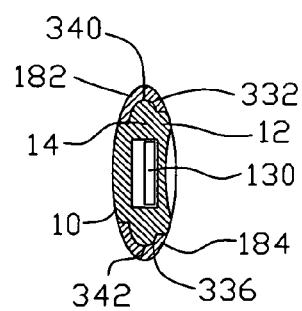
FIG. 77  FIG. 78

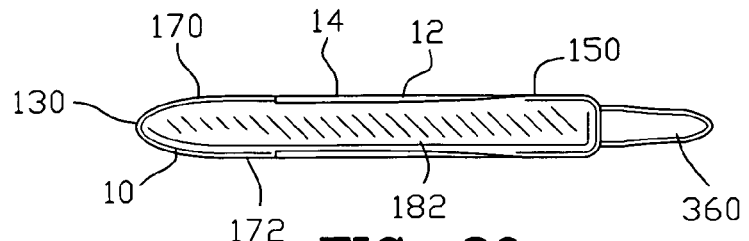
FIG. 80
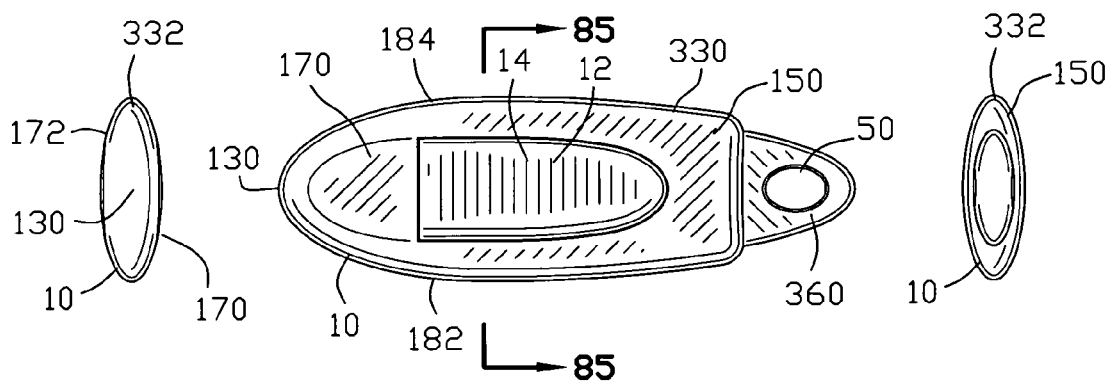
FIG. 81    FIG. 79    FIG. 82
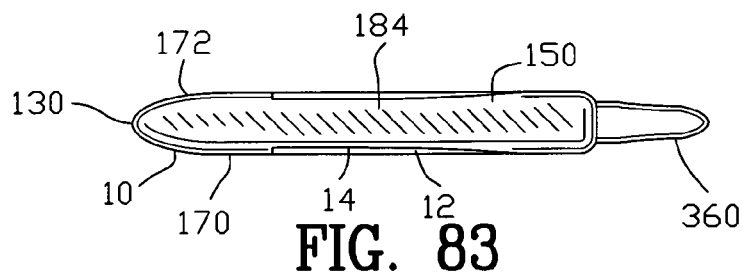
FIG. 83
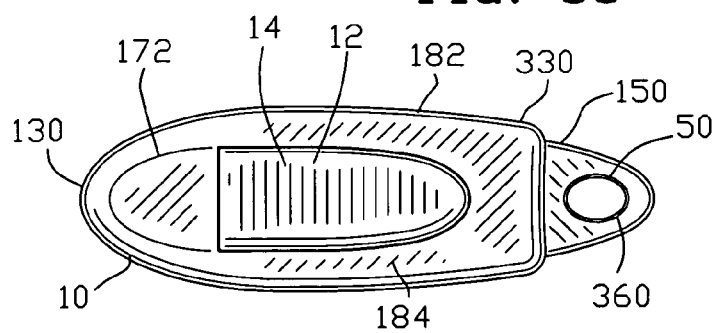 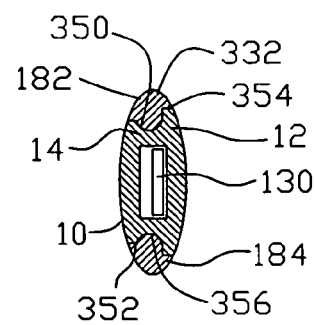
FIG. 84    FIG. 85

SLEEVE AND COUPLER FOR ELECTRONIC DEVICE

CROSS-REFERENCE TO RELATED APPLICATIONS

This application claims benefit of U.S. Patent Provisional application Ser. No. 60/899,900 filed Feb. 7, 2007. All subject matter set forth in provisional application Ser. No. 60/899,900 is hereby incorporated by reference into the present application as if fully set forth herein.

BACKGROUND OF THE INVENTION

1. Field of the Invention

This invention relates to shielding and coupling and more particularly to an improved apparatus for shielding an electronic storage device and an improved apparatus for coupling an electronic device to a computer device.

2. Background of the Invention

USB flash drives are memory data storage devices integrated with a USB interface. USB flash drives are preferable over many other data storage devices in that the USB flash drives are typically small, lightweight, removable and rewritable. The USB flash drives consist of a small printed circuit board encased in a plastic or metal casing. A USB connection allows the USB flash drives to connect directly to a port on a personal computer. The plastic or metal casing makes the USB flash drives sturdy enough for transporting singularly or in conjunction with a lanyard or key ring. In a typical USB flash drive only the USB connector protrude from the plastic or metal casing.

Since the USB connector extends outside of the plastic or metal casing, the connector is vulnerable to damage by striking a foreign object or intrusion of particles or moisture. In addition, once the connector is engaged into the port on a personal computer, the casing extends outside of the personal computer. If the casing is stuck while the casing is engaged with the port on a personal computer, the USB connector and/or the port may be damaged. The following U.S. patents are examples of attempt of the prior art to solve these problems.

U.S. Pat. No. 6,456,500 to Chen discloses an assembling structure for a portable memory device, including a memory device main body composed of a bottom cover, an upper cover and a circuit board. Two corners of one end of the bottom cover is formed with recessed sections. The other end thereof is formed with a thread hole. The upper cover is formed with hook boards and a through hole corresponding to the recessed sections and thread hole. The upper cover is mated and locked with the bottom cover by a bolt to clamp the circuit board. An adapter of the circuit board outward extends from the main body. A sheath is fitted around the main body. One end of the sheath is formed with a through hole through which the adapter outward protrudes. The sheath and the main body are formed with corresponding stop board and lateral projecting blocks, whereby the main body is slidable within the sheath to extend the adapter out of the sheath or retract the adapter therein.

U.S. Pat. No. 6,522,534 to Wu discloses a convenient portable memory device including a cartridge member including a chamber and a cap member. The chamber is defined by a rigid wall for accommodating a memory unit. The chamber has an opening communicating with outer side of the cartridge member, whereby a USB plug or interface of the memory unit can extend through the opening out of the chamber. The cap member is detachably fitted with the chamber to close the opening thereof. The cap member defines an internal space for accommodating the USB plug or interface of the memory unit. The memory device further includes an accessory at least one end of which is restricted on the cap member. The accessory has a clip plate extending on outer side of the cartridge in a direction to the chamber to form a clip plate. The cartridge member serves to protect the memory unit and the plug thereof.

U.S. Pat. No. 6,612,853 to Wu discloses an extensible/retractable and storable portable memory device including a main body and a sheath. The main body has an adapter at one end. One end of the sheath is formed with an opening for fitting the adapter end of the main body. The other end of the sheath is formed with a through hole through which the adapter can outward protrude. Two sides of the sheath are formed with inward projecting stop boards. The middle portions of two sides of the main body are respectively formed with two lateral projecting blocks. The stop boards stop the lateral projecting blocks from outward sliding so that the main body is restricted to relatively slide within the sheath to extend the adapter out of the sheath or retract the adapter therein and locate the adapter in a predetermined position. Therefore, the memory device can be easily used and carried.

U.S. Pat. No. 6,758,689 to Bair, et al. discloses a system and a method for protecting a connector and a body of a wireless adapter with a geometrical loop antenna. The loop antenna folds over the body of the wireless adapter to protect the connector and the body. The wireless adapter may be used to connect a peripheral device to a host device. The body of the wireless adapter includes a body stop operable for receiving the loop antenna. The system may also include a cap for protecting the connector of the wireless adapter. In this instance, the loop antenna folds over the cap to lock the cap in place on the connector. A cap may also be integrated into the distal end of the loop antenna.

U.S. Pat. No. 6,763,410 to Yu discloses a portable USB memory device having a housing, a memory and driver board and a USB plug. The memory and driver board has a memory IC, a driver IC and some electronic components so that the thickness of the memory device is decreased and the memory device is only 3 times larger than the USB plug. The memory device is small enough small to adapt to mount in an external housing, which further is adapted to attach to other devices like key chains, belts, etc.

U.S. Pat. No. 6,808,400 to Tu discloses a USB structure with a protection device, especially applying to a USB connector structure without traditional cap but still with protection function. The invention adopts simple mechanism, spring and positioning structure, pivotal structure and rotational structure, to approach protection object, therefore it saves a lot on cost and manufacturing processes.

U.S. Pat. No. 6,905,352 to Chao discloses a USB portable disk-pen including a USB plug that is inserted to a computer at an upper pen shaft, and is joined as one body with a sheath. A printed circuit board is connected with one end of the sheath, penetrated into the sheath, and positioned along with the sheath in the upper pen shaft. The upper pen shaft is relative lighter in weight for not containing a refill, and is therefore steadier and less likely to wobble when being inserted to a computer, thereby preventing poor contact quality of the USB plug.

U.S. Pat. No. 6,932,629 to Ikenoue discloses a device main body with a USB terminal and a cap including a housing space for housing at least the USB terminal are provided. The device main body and the cap are assembled so that they can be moved in an extending or compressing manner relative to each other by inserting at least the USB terminal to the housing space, or can be rotated relative to each other in an extended state without removing the cap from the device main body.

U.S. patent D492,307 to Aqqad, et al. discloses a ornamental design for a housing for portable memory unit.

U.S. patent D494,969 to Lin discloses an ornamental design for an USB flash memory drive.

U.S. Patent Application 20030223286 to Lee discloses a flash memory apparatus having a single body type rotary cover, wherein a cover is not completely separated from the main body in any case whatsoever so that lost of the cover is prevented. The flash memory apparatus includes: a flash memory main body including a rectangular shaped case within which a memory element is mounted, an USB terminal piece electrically connected with the memory element and installed at a front end of the case in a projecting manner, and a hinge protuberance formed on at least one side among a front side and a back side; and a pair of parallel plate members facing each other with an interval corresponding to the thickness of the case, and whose front end is opened, whose terminal is closed and both the lateral ends of which are opened; in which the parallel plate members have a cover on which a hinge hole joined to the hinge protuberance, for pivoting on the shaft, is formed, so that the cover is rotated with respect to the flash memory main body, whereby the USB terminal piece is received in an inner space of the cover or exposed to the outside.

U.S. Patent Application 20040090751 to Choi; et al. discloses a portable USB storage device including a case, a USB port, and a control device. The case contains therein a data storage. The USB port can be inputted into the case in a sliding motion. The control device selectively controls a location of the USB port to keep the USB port.

U.S. Patent Application 20040212966 to Fisher; et al. discloses a portable external computer device having a connector for a standard computer interface and a integral cover, comprising, a USB-based mass storage memory device, and an "integrated" cover for the USB connector portion; such that the cover is automatically retractable so as to expose the connector for connection to a host computer.

U.S. Patent Application 20050009388 to Chao discloses a USB portable disk-pen including a USB plug that is inserted to a computer at an upper pen shaft, and is joined as one body with a sheath. A printed circuit board is connected with one end of the sheath, penetrated into the sheath, and positioned along with the sheath in the upper pen shaft. The upper pen shaft is relative lighter in weight for not containing a refill, and is therefore steadier and less likely to wobble when being inserted to a computer, thereby preventing poor contact quality of the USB plug.

Although the aforementioned prior art have contributed to the development of the art of shielding and coupling, none of these prior art patents have solved the needs of this art.

Therefore, it is an object of the present invention to provide an improved apparatus for shielding an USB connection.

Another object of this invention is to provide an improved apparatus for coupling an USB flash drive with a personal computer.

Another object of this invention is to provide an improved apparatus permitting removal of the shielding for exposing the USB connection.

Another object of this invention is to provide an improved apparatus that retains the removed shielding with the USB flash drive.

Another object of this invention is to provide an improved apparatus providing a key and key way engagement of the USB flash drive with the personal computer.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to a sleeve for engaging an electronic device. The electronic device includes a housing with plug extending therefrom. The housing has an engaging surface and a housing support surface. The sleeve comprises a plug cap for receiving the plug. A housing cap includes a cavity for receiving the housing. An elastic tether extends between the plug cap and the housing cap for securing the plug cap to the housing cap. The elastic tether is deformable for providing a first length during the plug cap engaging the plug. The elastic tether is deformable for providing a second length during the plug cap displaced above the plug. The elastic tether being is deformable for providing a third length during said plug cap removed from the plug.

In a more specific embodiment of the invention, the housing contains a portable memory electrically communicating with the plug. The housing includes a passage traversing from a top surface to a bottom surface. A first step extends above the top surface of the housing and is positioned adjacent to the passage. A second step extends above the bottom surface of the housing and is positioned adjacent to the passage. A first orifice is positioned on the housing cap and engages the first step for preventing movement of the housing cap relative to the housing during removal of the plug cap from the plug. A second orifice is positioned on the housing cap and engages the second step for preventing movement of the housing cap relative to the housing during removal of the plug cap from the plug.

In one example of the invention, the elastic tether includes a first elastic strand and a second elastic strand extending between the plug cap and the housing cap for securing the plug cap to the housing cap. A slot is defined between the first elastic strand and the second elastic strand for exposing the housing.

The invention further relates to a coupling for joining an electronic device and a computer device. The electronic device has a plug extending therefrom. The computer device has a plug receiver for engaging the plug for transferring data between the electronic device and the computer device. The coupling comprises a housing having a first end, a second end and a body. The first end of the housing defines a housing engaging surface. The body defines a contoured body cross section. A receptacle has an interior end, an exterior end and a wall surface. The interior end of the receptacle defines a receptacle surface for receiving the housing engaging surface. The wall surface defines a contoured wall cross section. The contoured body cross section is commensurate with the contoured wall cross section for inserting and keying the housing into the receptacle.

In a more specific embodiment of the invention, the housing contains a portable memory electrically communicating with the plug. The contoured body cross section of the body and the contoured wall cross section of the receptacle has a non-symmetrical cross section for permitting inserting and keying of the housing into the receptacle in only one orientation. The exterior end of the receptacle includes a guide having an interior aperture, an exterior aperture and a conical surface positioned therebetween. The interior aperture of the guide is positioned within the wall surface. The exterior aperture of the guide is commensurate to the exterior end of the receptacle. The exterior aperture has a first contoured guide cross section. The interior aperture has a second contoured guide cross section. The first contoured guide cross section is larger than the second contoured guide cross section for tapering the conical surface from the exterior end to the wall surface for directing the housing into the receptacle. The second contoured guide cross section is commensurate with the contoured body cross section of the body. The first contoured guide cross section is similar and larger than the contoured body cross section for inserting and keying the housing into the receptacle.

In one example of the invention, a finger extends from the housing engaging surface of the housing to a finger engaging surface. The finger defines a contoured finger cross section. A finger receptacle extends from the receptacle engaging surface of the receptacle to a finger supporting surface for receiving the finger engaging surface. The finger receptacle defines a contoured finger receptacle cross section. The contoured finger cross section is commensurate with the contoured finger receptacle cross section for inserting and keying the housing into the receptacle.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 72 is a top view of a fifth embodiment of an apparatus for engaging an electronic device incorporating the present invention;
FIG. 73 is a left side view of FIG. 72;
FIG. 74 is a front view of FIG. 72;
FIG. 75 is a rear view of FIG. 72;
FIG. 76 is a right side view of FIG. 72;
FIG. 77 is a bottom view of FIG. 72;
FIG. 78 is a section view along line 78-78 in FIG. 72;
FIG. 79 is a top view of a sixth embodiment of an apparatus for engaging an electronic device incorporating the present invention;
FIG. 80 is a left side view of FIG. 79;
FIG. 81 is a front view of FIG. 79;
FIG. 82 is a rear view of FIG. 79;
FIG. 83 is a right side view of FIG. 79;
FIG. 84 is a bottom view of FIG. 79;
FIG. 85 is a section view along line 85-85 in FIG. 79.

Similar reference characters refer to similar parts throughout the several Figures of the drawings.

DETAILED DISCUSSION

Figure 1:
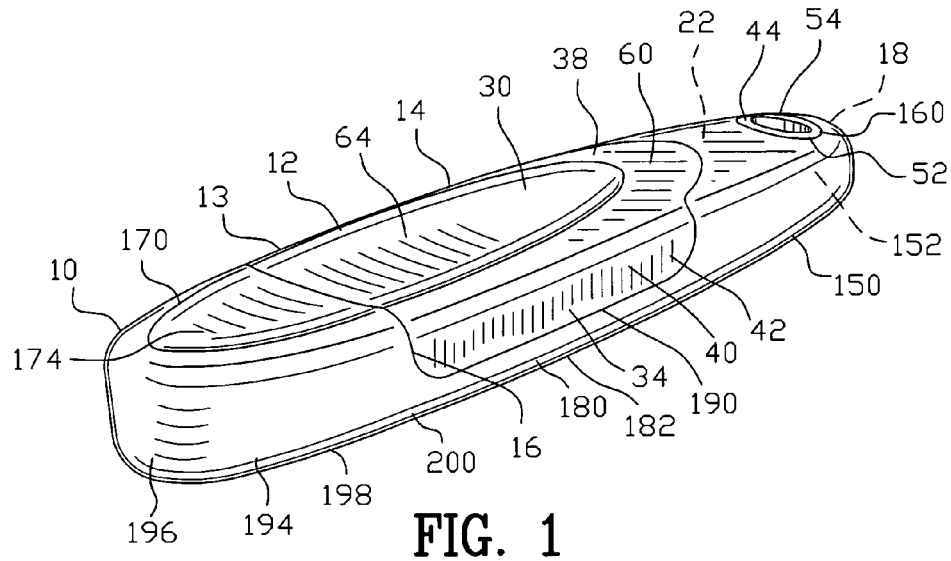
FIG. 1 is a top isometric view of a first embodiment of an apparatus for engaging an electronic device incorporating the present invention.

FIGS. 1-10 are various views of a sleeve 10 for engaging an electronic device 12. The electronic device 12 may be a USB flash memory device 13. The electronic device 12 may include other electronic devices such as a USB WiFi antenna or other USB devices.

FIGS. 1-35 are various views of the electronic device 12 including a housing 14 having a first end 16 and a second end 18. The first end 16 of the housing 14 defines a housing engaging surface 20 and the second end 18 of the housing 14 defines a housing support surface 22. A plug 24 extends from the housing engaging surface 20 of the housing 14. The plug defines an input end 25 distanced from the housing engaging surface 20 by a neck 26. As best seen in FIGS. 86-91, the plug 24 engages a computer device 28 for transferring data between the electronic device 12 and the computer device 28.

The housing 14 further includes a top surface 30 and a bottom surface 32. The top surface 30 and the bottom surface 32 are distanced by a first side surface 34 and a second side surface 36. The housing 14 comprises a body 38 having a contoured body cross section 40. The contoured body cross section 40 may include a non-symmetrical cross section 42 for permitting inserting and keying of the housing 14 into the computer device 26 in only one orientation.

The top surface 30 may include a first step 44 that extends from the top surface 30. Preferably, the first step 44 is positioned adjacent to the second end 18. Similarly, the bottom surface 32 may include a second step 46 that extends from the bottom surface 32. Preferably, the second step 46 is positioned adjacent to the second end 18.

A passage 50 is positioned at the second end 18 and extends from the top surface 30 to the bottom surface 32. The first step 44 may comprise a first annular member 52 defining a first hole 54. The first annular member 52 is positioned above the passage 50 for allowing a tether to be inserted through the housing 14. The second step 46 may comprise a second annular member 56 defining a second hole 58. The second annular member 56 is positioned below the passage 50 for allowing a tether to be inserted through the housing 14.

The top surface 30 may further include a top contact surface 60 which is elevated above a top depressed surface 62. The top contact surface 60 includes a recessed concave portion 64 for assisting in grasping of the housing 14 by an operator 8. The bottom surface 32 may further include a bottom contact surface 66 which is elevated above a bottom depressed surface 68. The bottom contact surface includes a raised convex surface 69 for assisting in grasping of the housing 14 by the operator 8.

Figure 2:
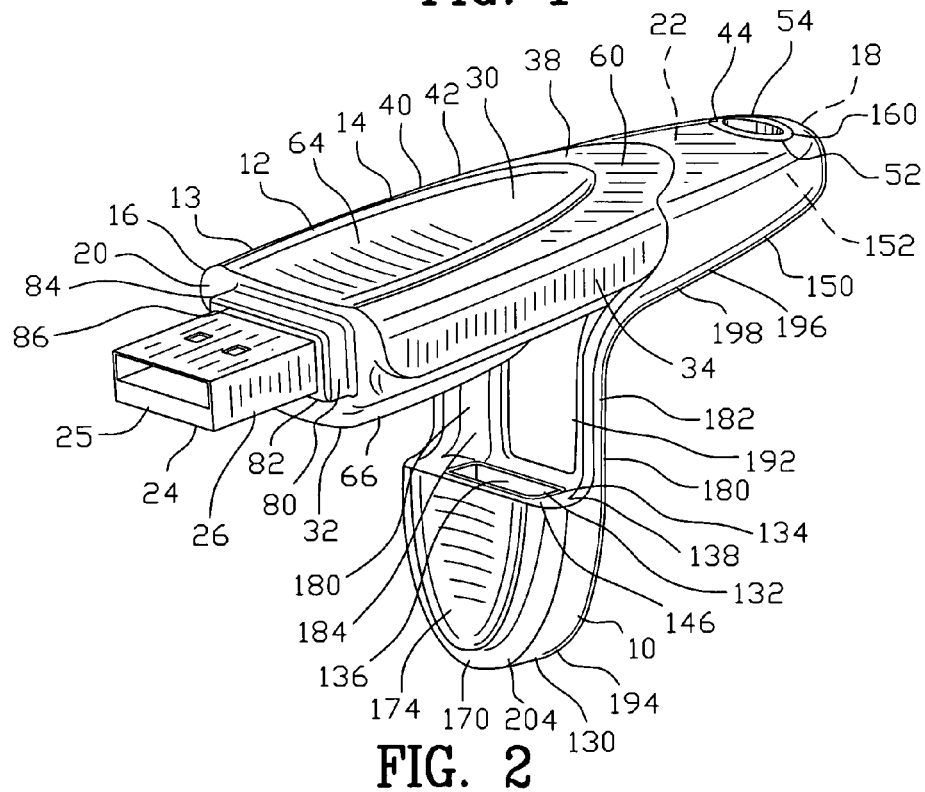
FIG. 2 is a view of FIG. 1 with a plug cap removed from the electronic device.
Figure 3:
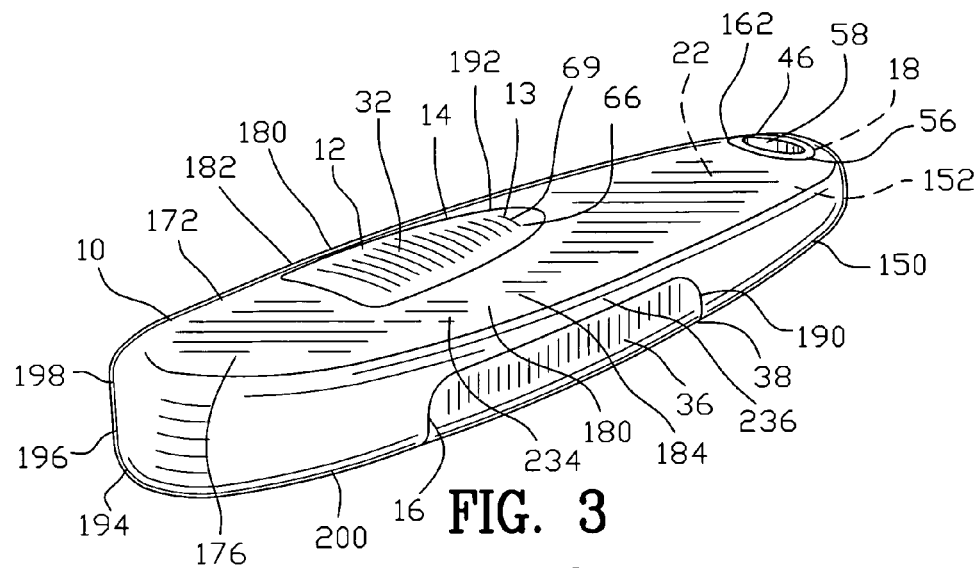
FIG. 3 is a bottom isometric view of FIG. 1.
Figure 4:
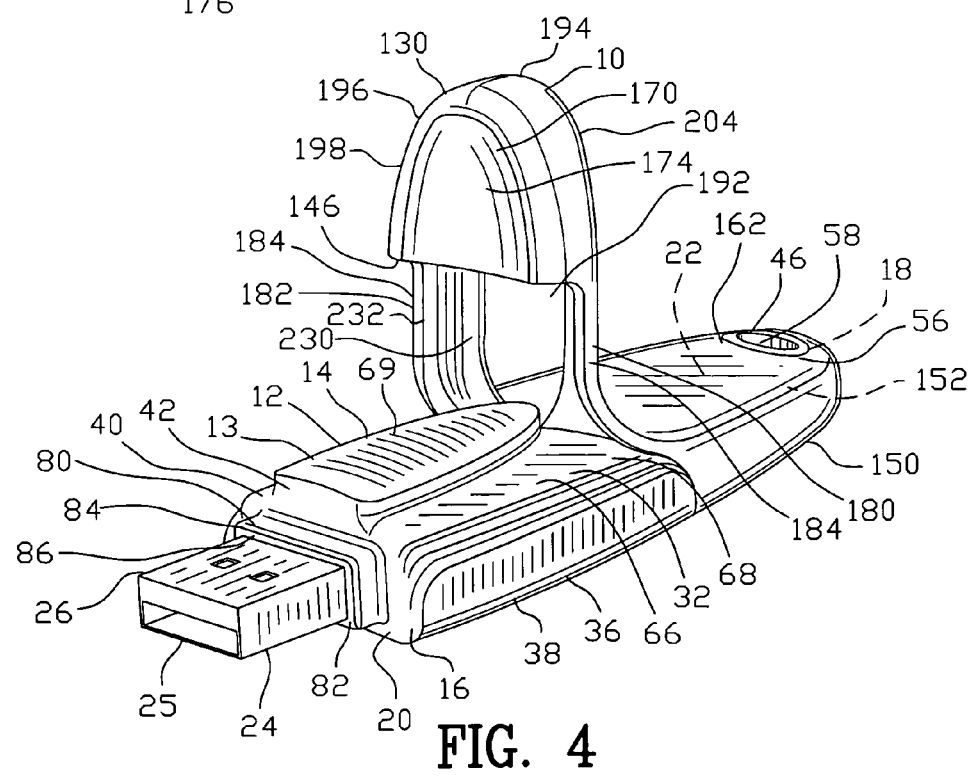
FIG. 4 is a view of FIG. 3 with the plug cap removed from the electronic device.
Figure 5:
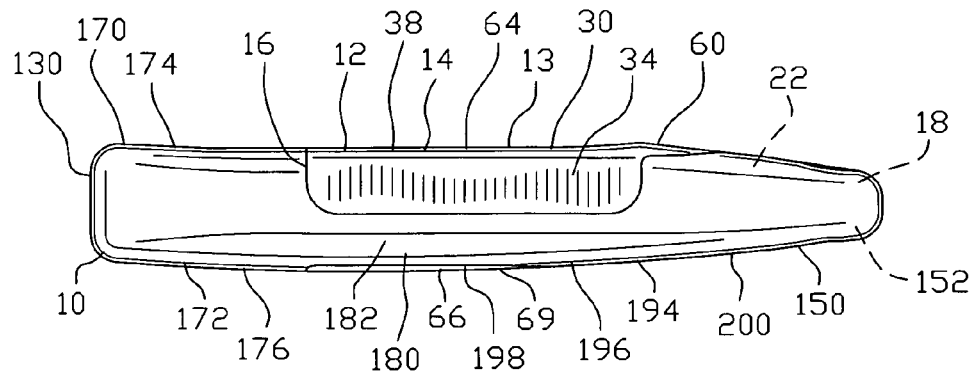
FIG. 5 is a side view of FIG. 1.
Figure 6:
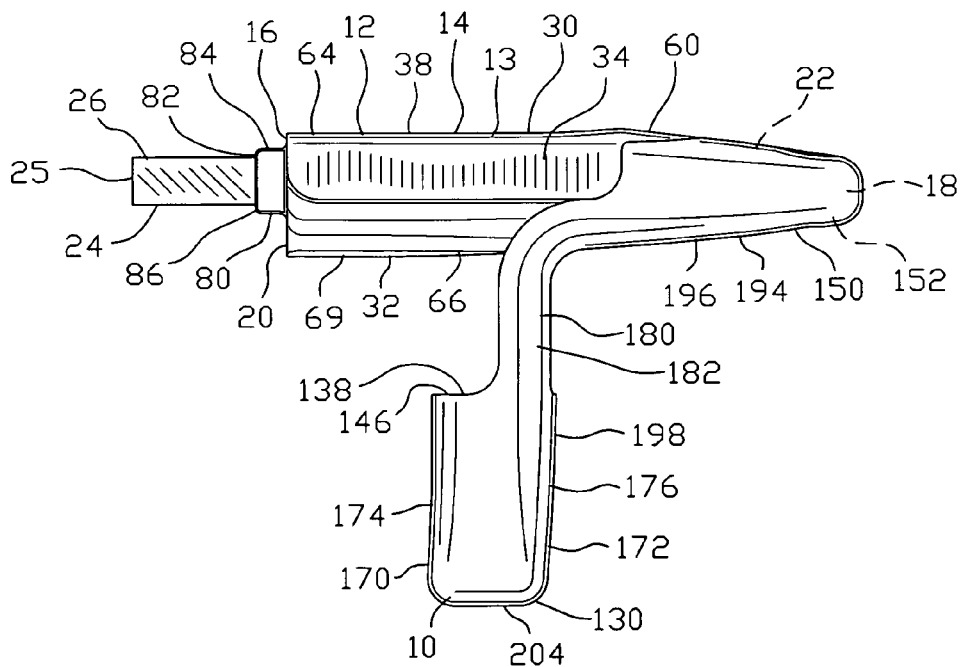
FIG. 6 is a view of FIG. 5 with the plug cap removed from the electronic device.
Figure 7:
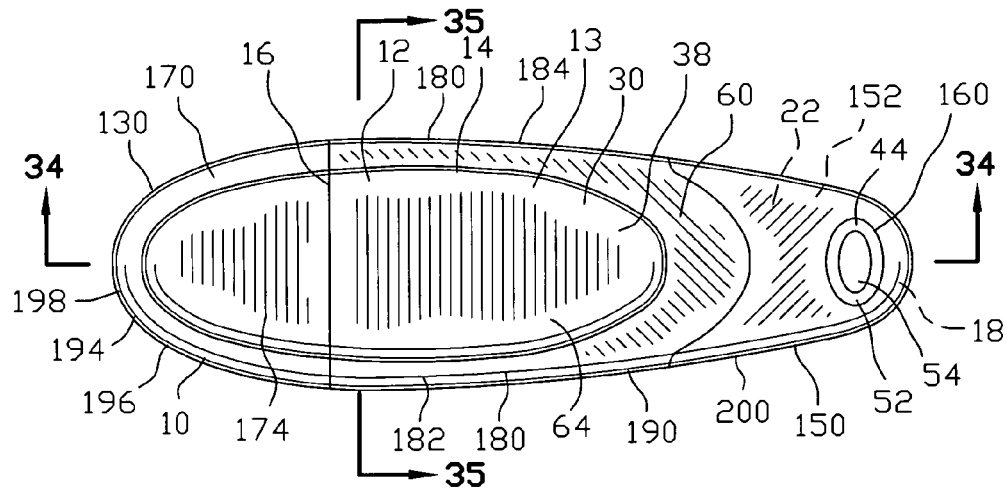
FIG. 7 is a top view of FIG. 1.
Figure 8:
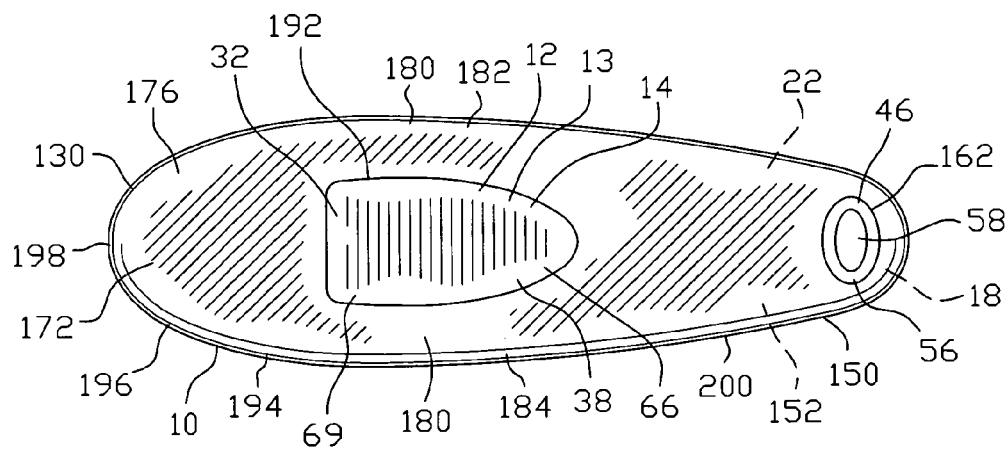
FIG. 8 is a bottom view of FIG. 1.
Figure 9:
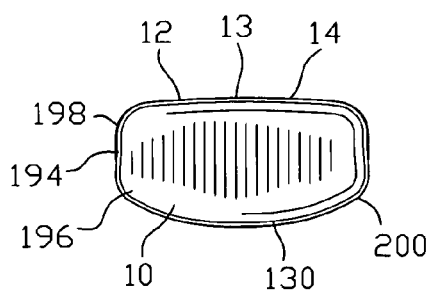
FIG. 9 is a front view of FIG. 1.
Figure 10:
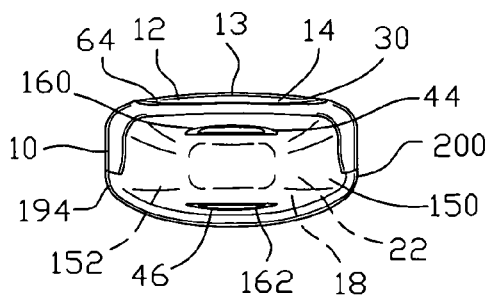
FIG. 10 is a rear view of FIG. 1.
Figure 11:
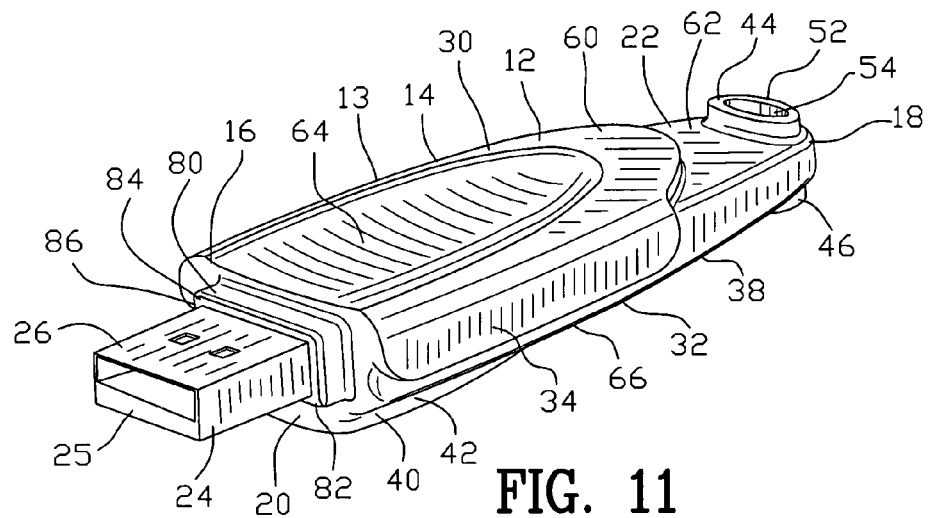
FIG. 11 is a front and top isometric view of a housing of FIGS. 1-10.
Figure 12:
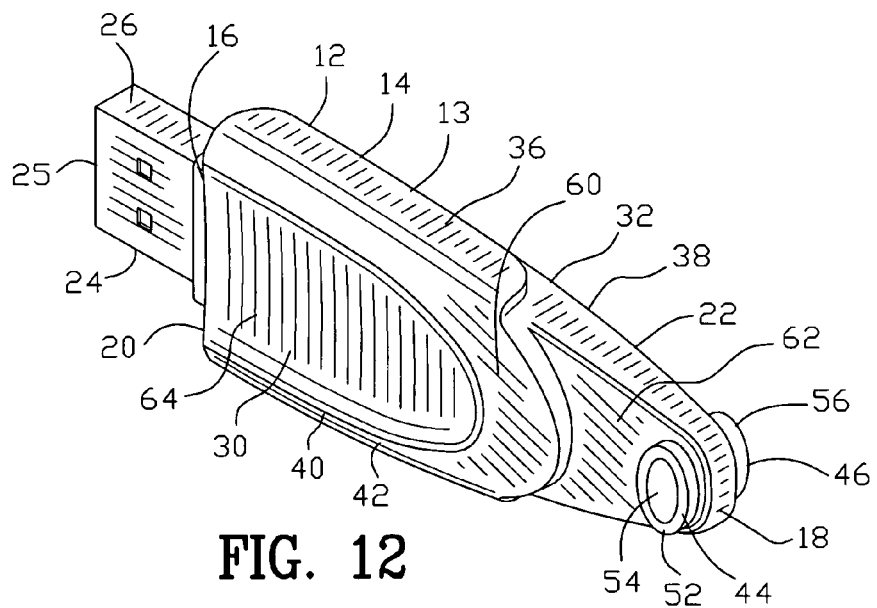
FIG. 12 is a rear and top isometric view of FIG. 11.
Figure 13:
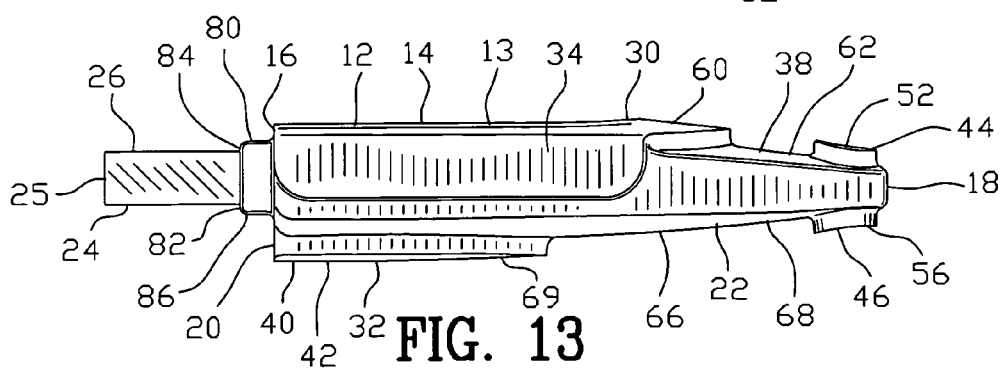
FIG. 13 is a side view of FIG. 11.
Figure 14:
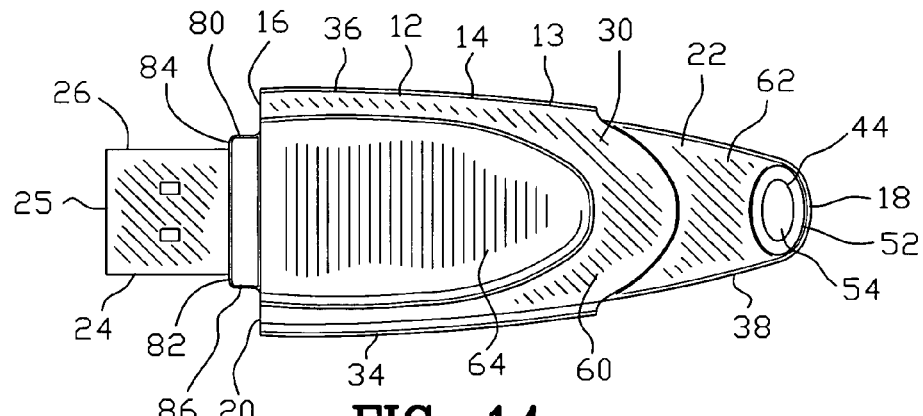
FIG. 14 is a top view of FIG. 11.
Figure 15:
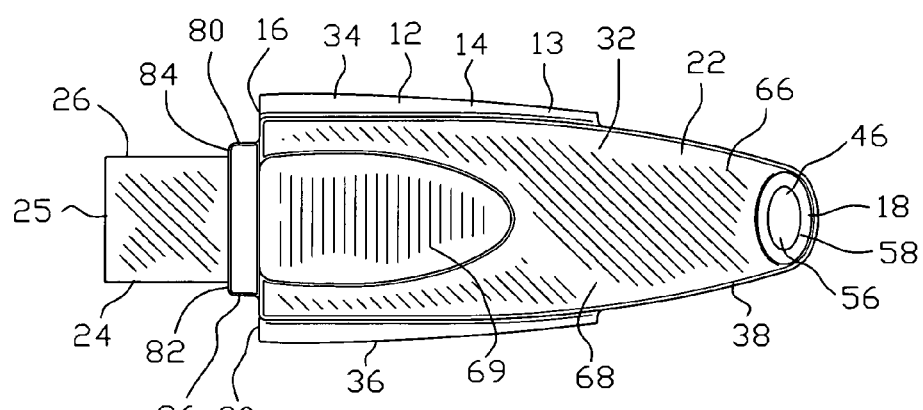
FIG. 15 is a bottom view of FIG. 11.
Figure 16:
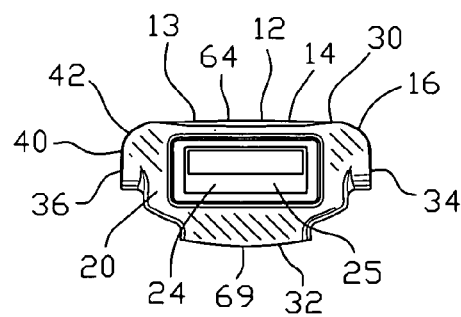
FIG. 16 is a front view of FIG. 11.
Figure 17:
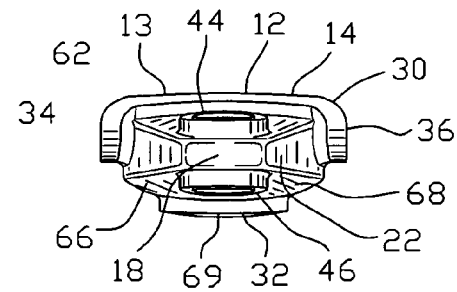
FIG. 17 is a rear view of FIG. 11.
Figure 18:
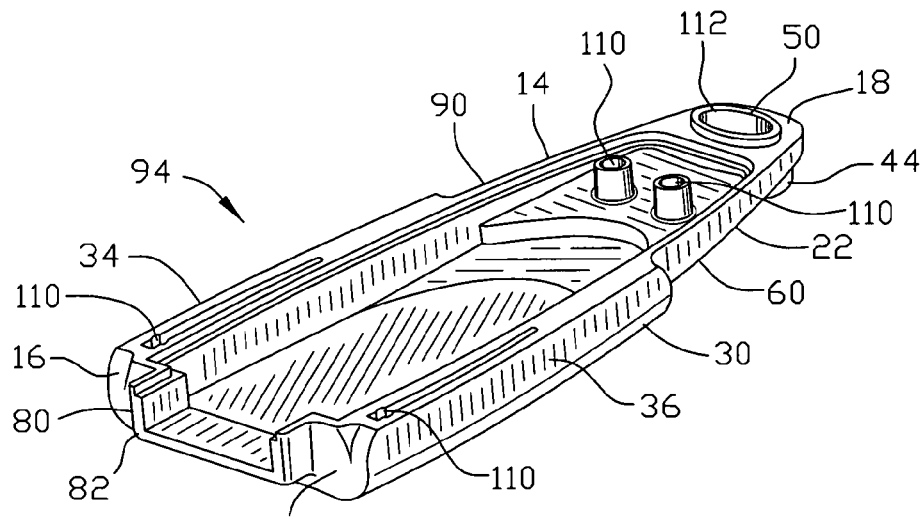
FIG. 18 is a front isometric view of a top portion of the housing of FIGS. 1-17.
Figure 19:
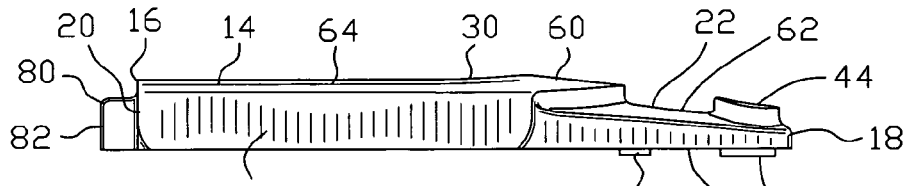
FIG. 19 is a side view of FIG. 18.
Figure 20:
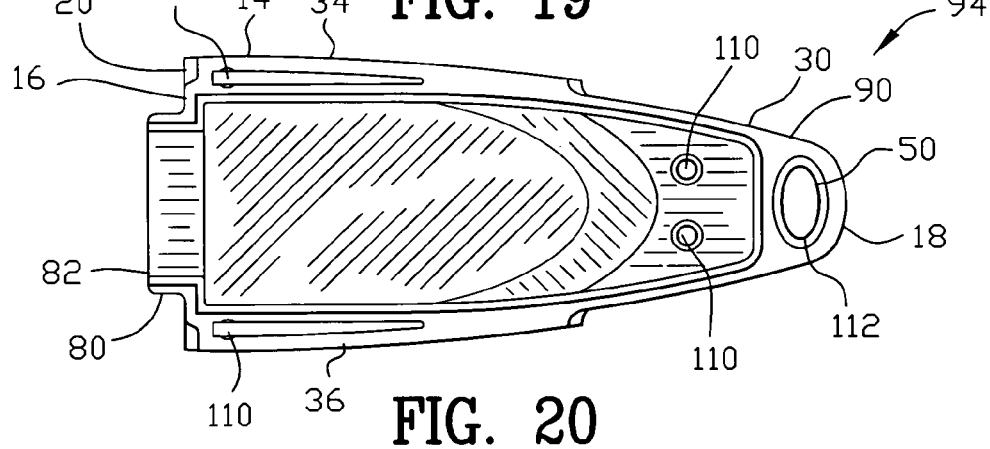
FIG. 20 is a top view of FIG. 18.
Figure 21:
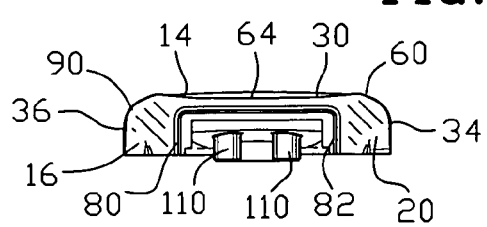
FIG. 21 is a front view of FIG. 18.
Figure 22:
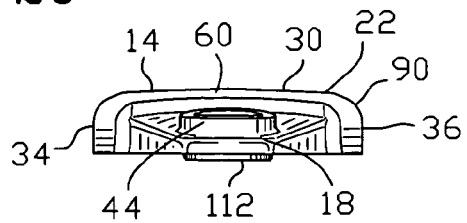
FIG. 22 is a rear view of FIG. 18.
Figure 23:
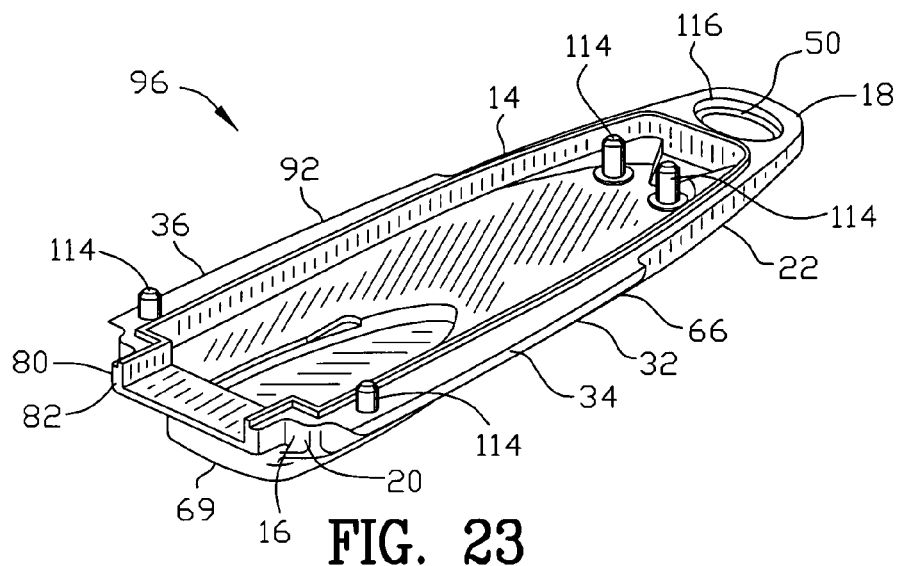
FIG. 23 is a front isometric view of a bottom portion of the housing of FIGS. 1-17.
Figure 24:
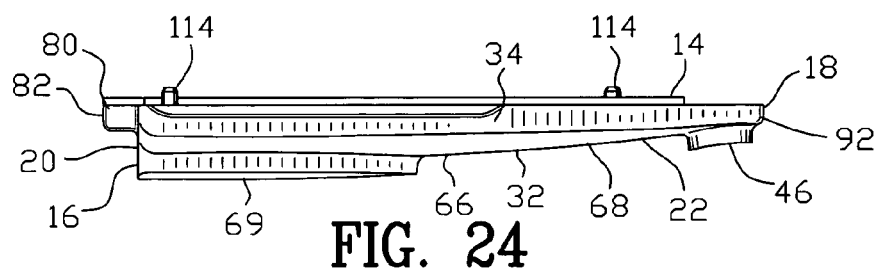
FIG. 24 is a side view of FIG. 23.
Figure 25:
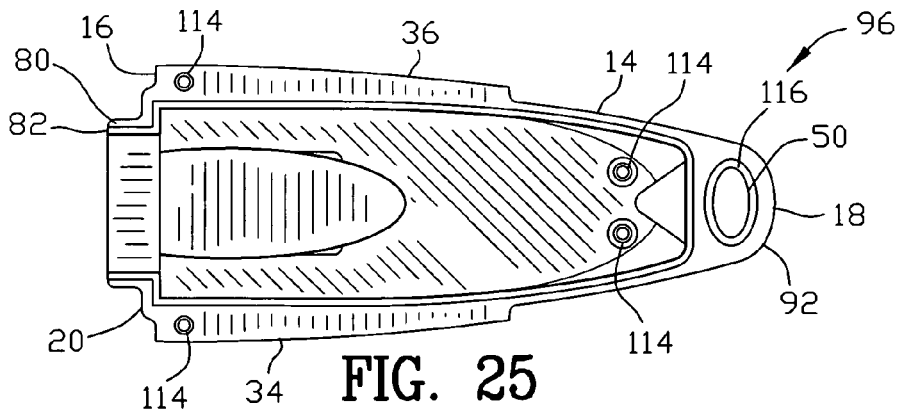
FIG. 25 is a top view of FIG. 23.
Figure 26:
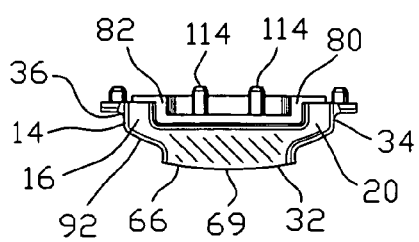
FIG. 26 is a front view of FIG. 23.
Figure 27:
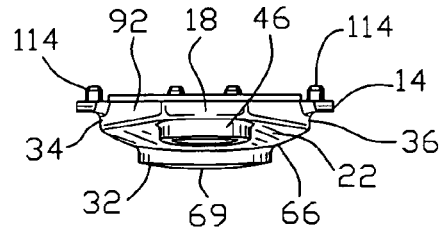
FIG. 27 is a rear view of FIG. 23.
Figure 28:
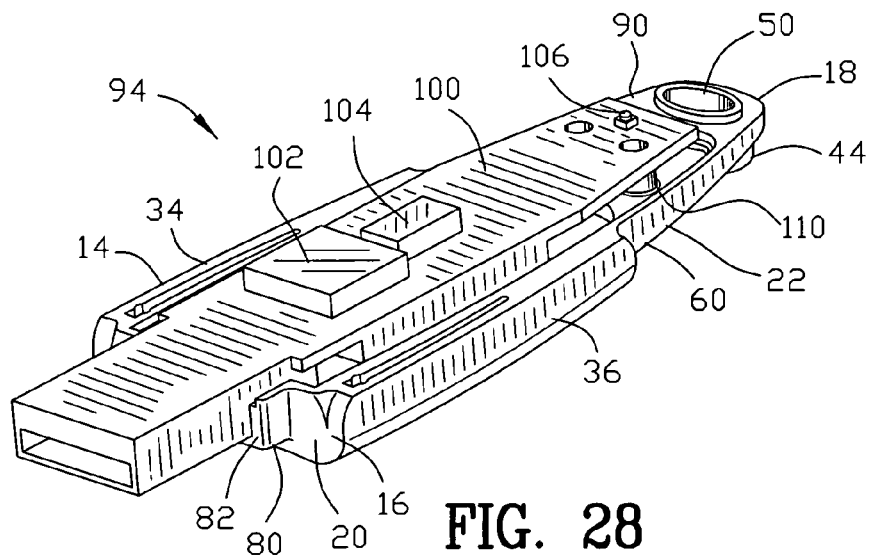
FIG. 28 is a front isometric view similar to FIG. 18 illustrating a plug and a portable memory positioned into the top portion of the housing.
Figure 29:
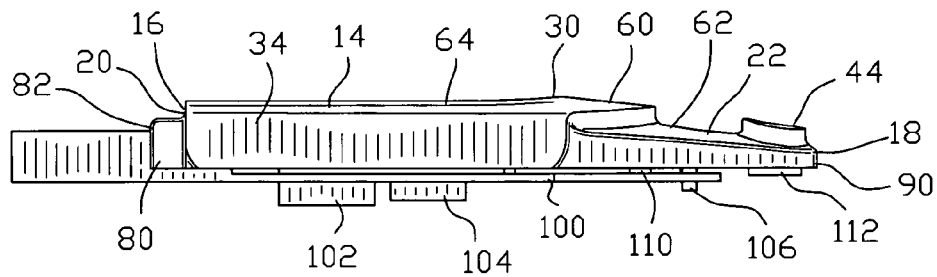
FIG. 29 is a side view of FIG. 28.
Figure 30:
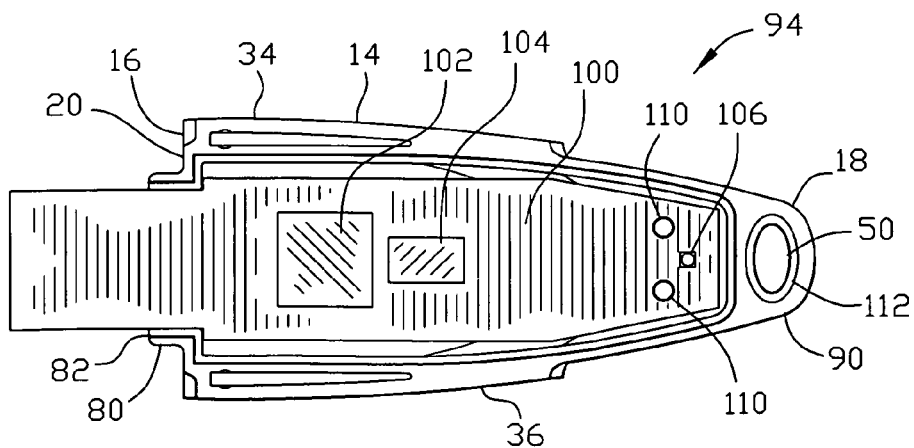
FIG. 30 is a top view of FIG. 28.
Figure 31:
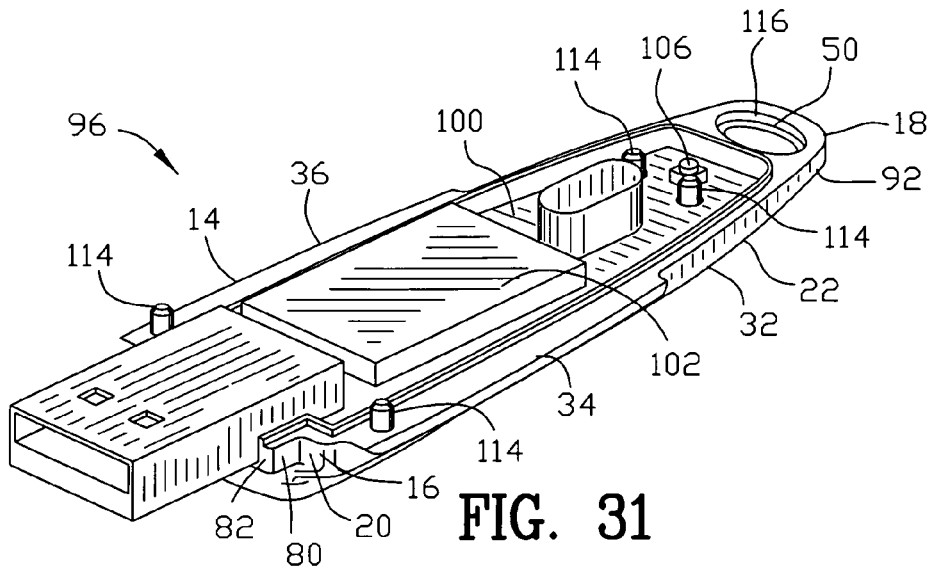
FIG. 31 is a front isometric view similar to FIG. 23 illustrating the plug and a portable memory positioned into the bottom portion of the housing.
Figure 32:
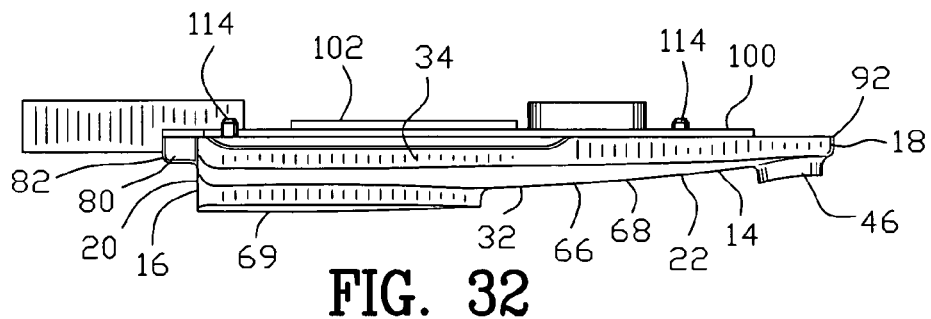
FIG. 32 is a side view of FIG. 31.
Figure 33:
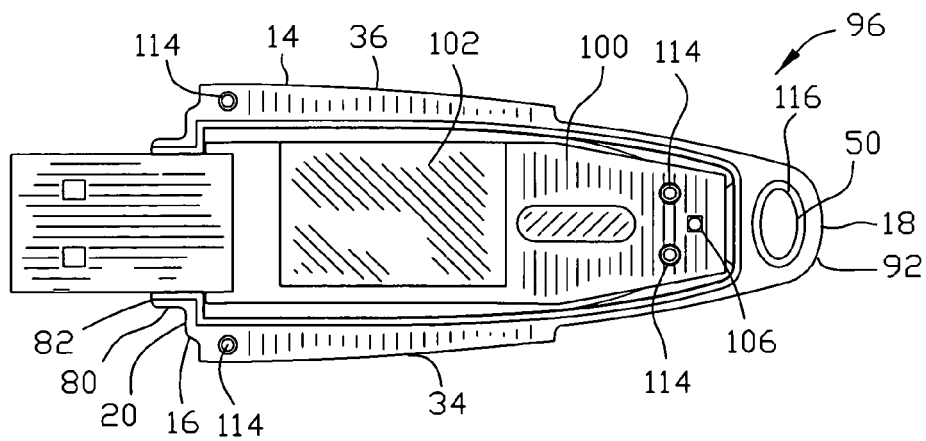
FIG. 33 is a top view of FIG. 31.
Figure 34:
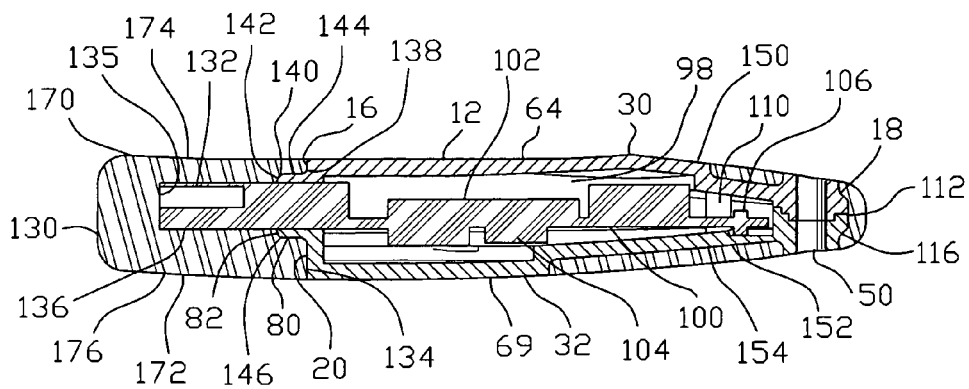
FIG. 34 is a section view along line 34-34 in FIG. 7.
Figure 35:
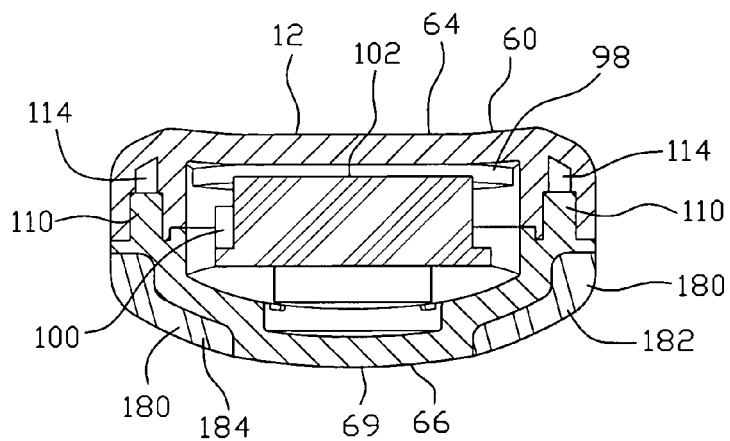
FIG. 35 is a section view along line 35-35 in FIG. 8.
Figure 36:
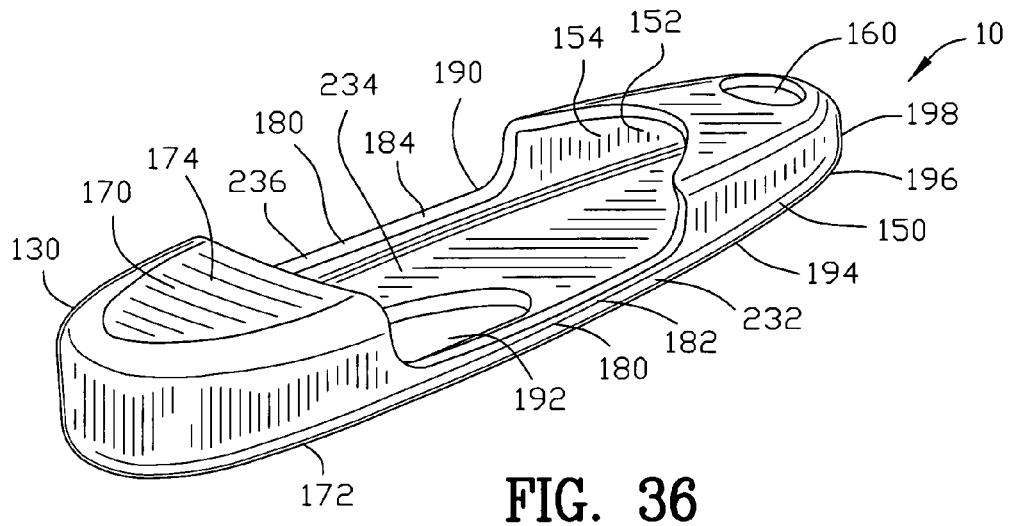
FIG. 36 is a front and top isometric view of a sleeve of FIGS. 1-10.
Figure 37:
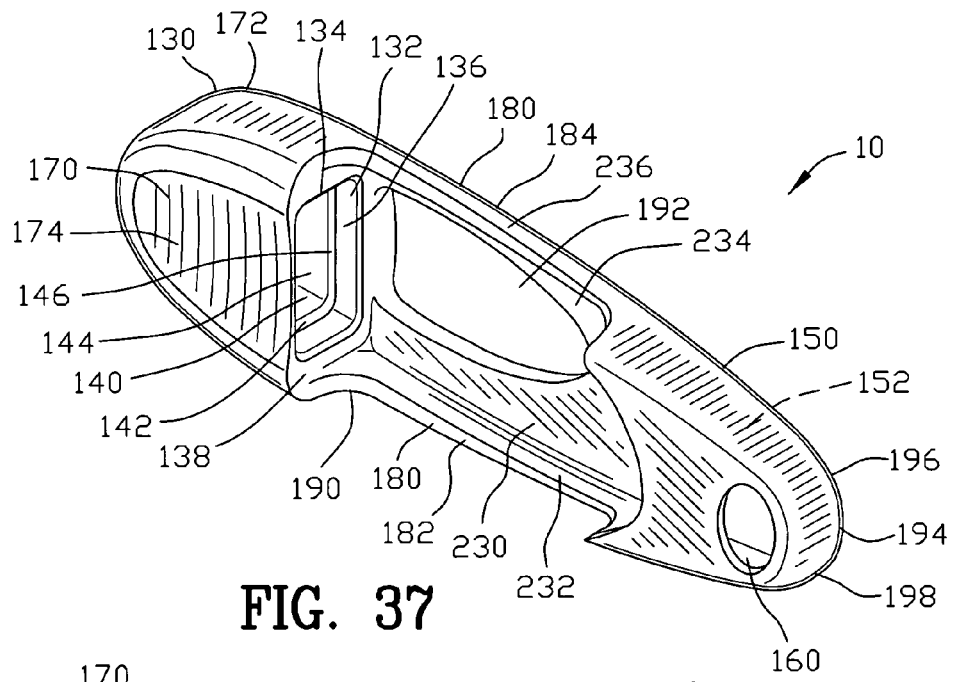
FIG. 37 is a rear and top isometric view of FIG. 36.
Figure 38:
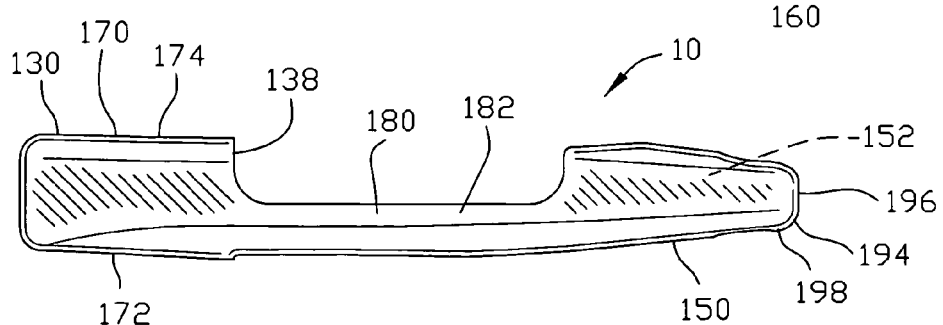
FIG. 38 is a side view of FIG. 36.
Figure 39:
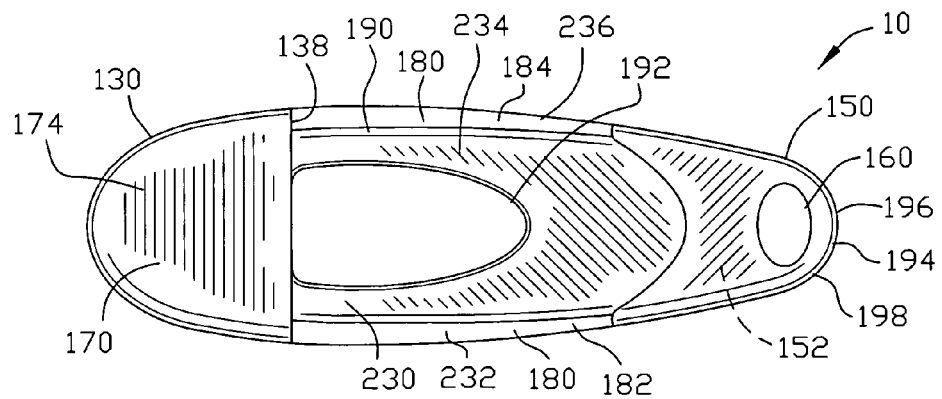
FIG. 39 is a top view of FIG. 36.
Figure 40:
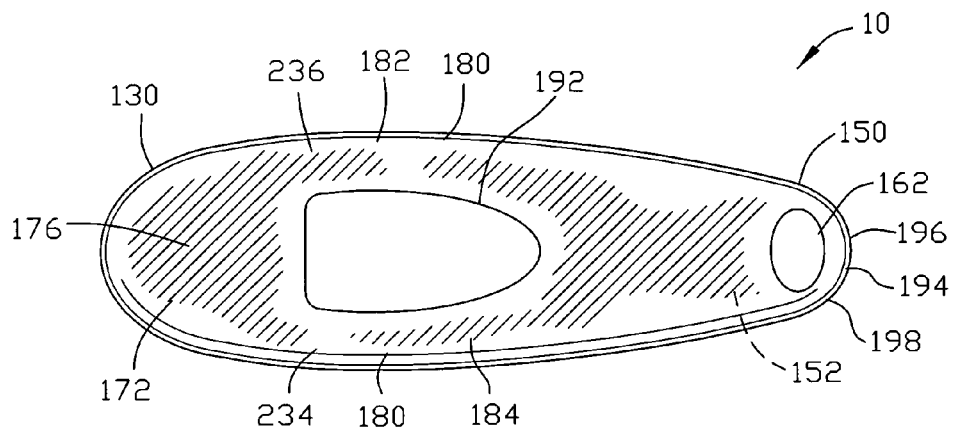
FIG. 40 is a bottom view of FIG. 36.
Figure 41:
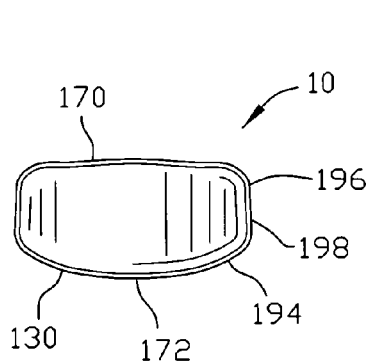
FIG. 41 is a front view of FIG. 36.
Figure 42:
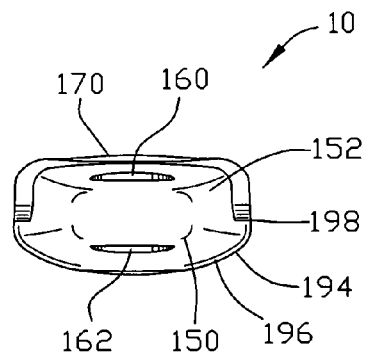
FIG. 42 is a rear view of FIG. 36.
Figure 43:
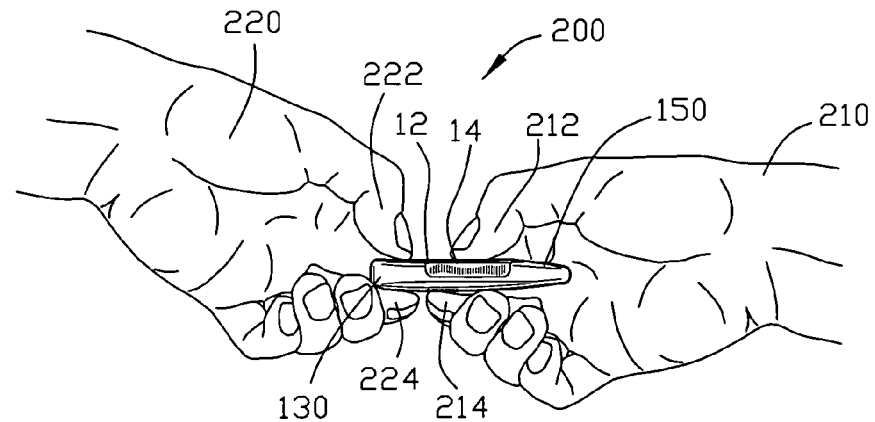
FIG. 43 is a view similar to FIG. 5 illustrating the plug cap engaging the electronic device.

In a first embodiment, the first side surface 34 may comprise a first side contact surface 70 that is elevated above a first side depressed surface 72. As best seen in FIG. 2, the first side contact surface 70 is adjacent to the top surface 30. The second side surface 36 may comprise a second side contact surface 74 that is elevated above a second side depressed surface 76. The second side contact surface 74 is adjacent to the top surface 30.

A finger 80 extends from the housing engaging surface 20 to a finger engaging surface 82. the finger 80 defines a contoured finger cross section 84. The contoured finger cross section 84 may include a non-symmetrical cross section 86 for permitting inserting and keying of the housing 14 into the computer device 26 in only one orientation.

As best seen in FIGS. 18-35 the housing 14 may include a first half portion 90 and a second half portion 92. The first and second half portion 90 and 92 include a first and second cavity 94 and 96 respectively for creating a housing cavity 98 upon the mating of the first and second half portions 90 and 92. The housing cavity 98 houses an electronic circuit board 100 that is electrically coupled to the plug 24. The electronic circuit board 100 may include a memory circuit 102, a clock circuit 104 and a light emitting device 106 for indicating transmission of the data between the electronic device 12 and the computer device 26.

The first half portion 90 may include a plurality of pin receivers 110 and an annular key 112. The second half portion 92 may include a plurality of pins 114 and an annular key receiver 116. The pin receivers 110 receive the pins 114 and the annular key 112 receives the annular key receiver 116 for keying the first half portion 90 to the second half portion 92. An adhesive may be utilized to retain the first half portion 90 adjacent to the second half portion 92.

The housing 14 may be constructed from a polymeric material by an injection molding process. The polymeric material may further include a translucent polymeric material to permit light from the light emitting device 106 to traverse through the housing 14.

A first embodiment of the sleeve 10 is best seen in FIGS. 1-10 and 36-42. The sleeve 10 provides a protective covering of the housing 14. The sleeve 10 comprises a plug cap 130 including a bore 132, a cap rim 134 and a cap end 135. The bore 132 defines a bore surface 136 for receiving the plug 24. The cap rim 134 defines a first cap engaging surface 138 for positioning adjacent to the housing engaging surface 20 of the housing 14. Preferably, the geometry of the bore 132 is commensurate with the geometry of the plug 24 of the housing 14 to prevent any voids between the bore surface 136 and the plug 24. If the first cap engaging surface 138 is retained adjacent to the housing engaging surface 20, the plug 24 is not exposed to moisture, debris and/or damage from striking a foreign object.

The bore 132 may further include a finger bore 140 and a finger rim 142. The finger bore 140 defines a finger bore surface 144 for receiving the finger 80. The finger rim 142 defines a second cap engaging surface 146 for positioning adjacent to the finger engaging surface 82 of the housing 14. Preferably, the geometry of the finger bore 140 is commensurate with the geometry of the finger 80 of the housing 14 to prevent any voids between the finger bore surface 144 and the finger 80. If the second cap engaging surface 146 is retained adjacent to the finger engaging surface 20, the plug 24 is not exposed to moisture, debris and/or damage from striking a foreign object.

The sleeve further comprises a housing cap 150 having a cavity 152. The cavity 152 defines a cavity surface 154 for receiving the housing support surface 22 of the housing 14. Preferably, the geometry of the cavity 152 is commensurate with the geometry of the housing support surface 22 of the housing 14 to prevent any voids between the cavity surface 154 and the housing support surface 22.

The housing cap 150 may include a first orifice 160 for engaging the first step 44 of the top surface 30. Preferably, the first orifice 160 fictionally encircles the first step 44 for preventing lateral movement of the housing cap 140 relative to the housing 14. In addition, the housing cap 140 may also include a second orifice 162 for engaging the second step 46 of the bottom surface 32. Preferably, the second orifice 162 fictionally encircles the second step 46 for preventing lateral movement of the housing cap 140 relative to the housing 14.

The plug cap 130 defines a top cap surface 170 and a bottom cap surface 172. The top cap surface 170 includes a cap concave portion 174 for assisting in grasping of the plug cap 130 by the operator 8. The bottom cap surface 172 includes a cap convex surface 176 for assisting in grasping of the housing 14 by the operator 8.

An elastic tether 180 extends between the plug cap 130 and the housing cap 140 for securing the plug cap 130 to the housing cap 140. The elastic tether 180 may include a first and a second elastic strand 182 and 184 extending between the plug cap 130 and the housing cap 140. The first and second elastic strand 182 and 184 define a first slot 190 for exposing the recessed concave portion 64 of the top contact surface 60. The first and second elastic strand 182 and 184 further define a second slot 192 for exposing the cap convex surface 176 of the bottom cap surface 172.

Preferably, the plug cap 130, the housing cap 150 and the elastic tether 180 are an integral one piece unit 194. The plug cap 130, the housing cap 150 and the elastic tether 180 may be constructed from a polymeric material 196 or other elastic material. Furthermore, the plug cap 130, the housing cap 150 and the elastic tether 180 may be constructed from a translucent polymeric material 198 to permit transmission of light rays generated from the light emitting device 106 through the sleeve 10.

As best seen in FIGS. 1, 3, 5, 7-10, 34, 35 and 43, the elastic tether 180 is deformable for providing a first length 200 during the plug cap 130 engaging the plug 24 for concealing the plug 24. More specifically, the elastic tether 180 applies a compressive force between the plug cap 130 and the housing cap 150 for maintaining the first cap engaging surface 138 adjacent to the housing engaging surface 20, the second cap engaging surface 146 adjacent to the finger engaging surface 20 and the input end 25 of the plug 24 adjacent to the cap end 135 of the plug cap 130. The direct contact between the first cap engaging surface 138 with the housing engaging surface 20, between the second cap engaging surface 146 with the finger engaging surface 20 and between the input end 25 of the plug 24 with the cap end 135 of the plug cap 130 protects the plug 24 from moisture, debris and/or damage from striking a foreign object.

Figure 44:
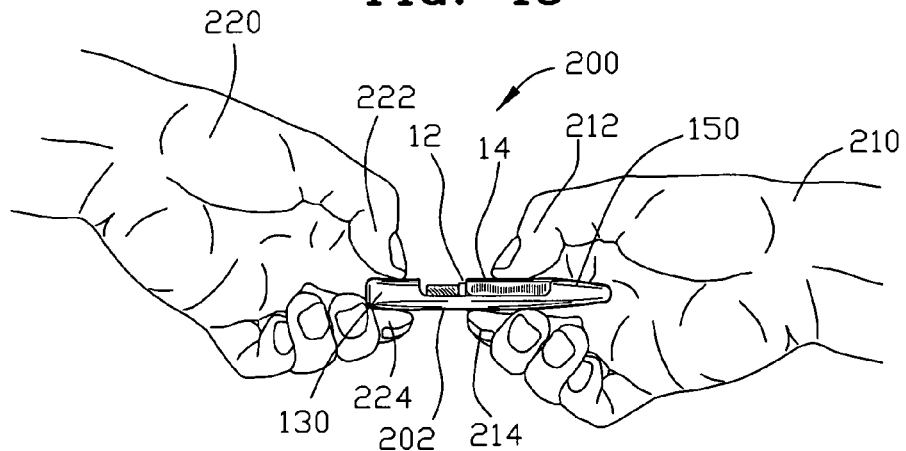
FIG. 44 is a view similar to FIG. 43 illustrating the plug cap disengaging the electronic device.
Figure 45:
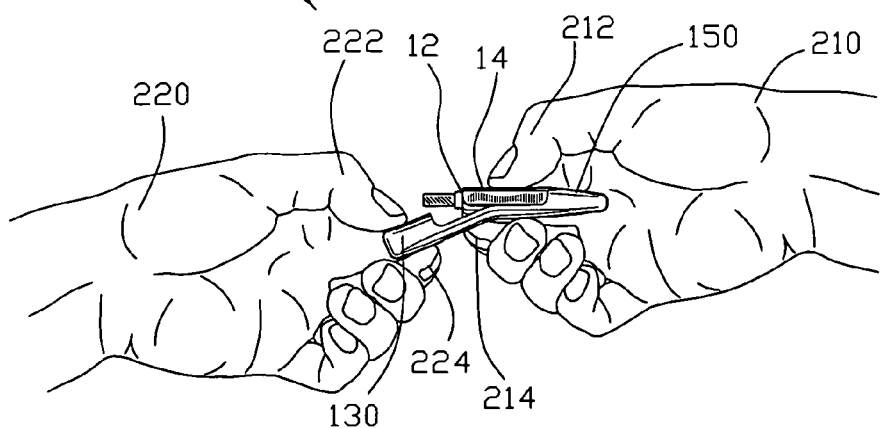
FIG. 45 is a view similar to FIG. 44 illustrating the plug cap removed from the electronic device.
Figure 46:
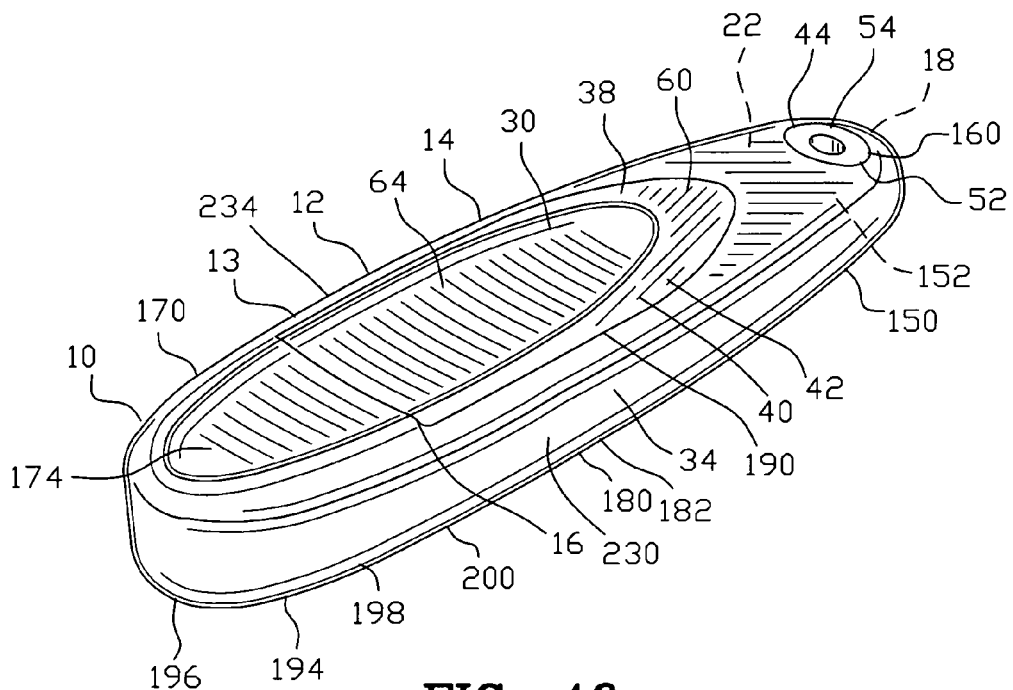
FIG. 46 is a top isometric view of a second embodiment of an apparatus for engaging an electronic device incorporating the present invention.
Figure 47:
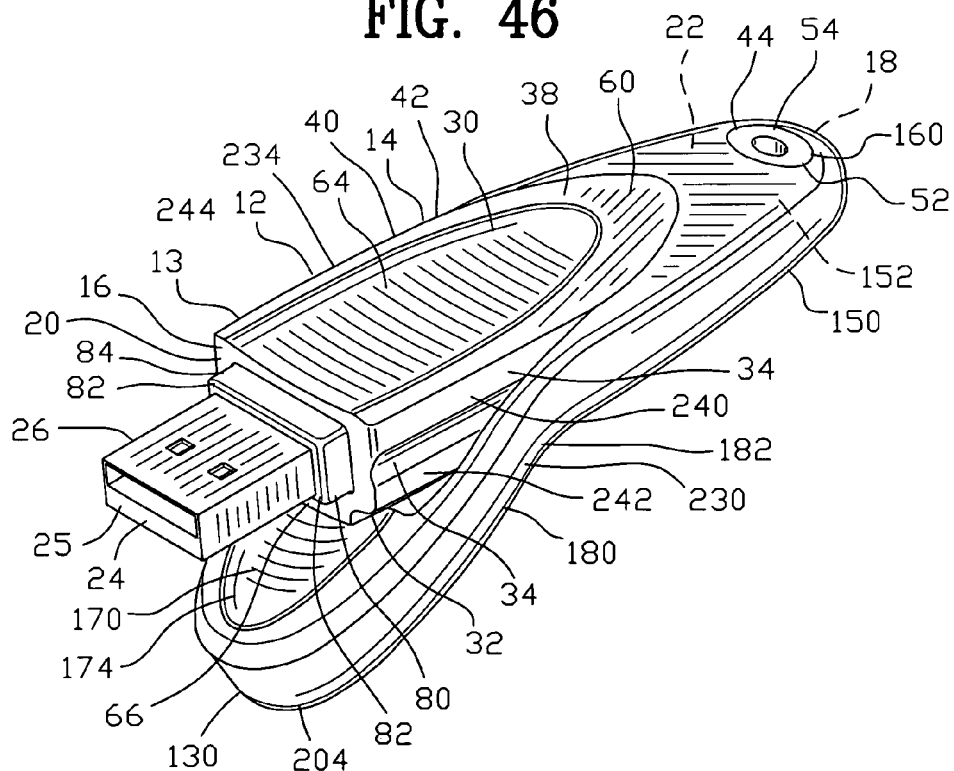
FIG. 47 is a view of FIG. 46 with the plug cap removed from the electronic device.
Figure 48:
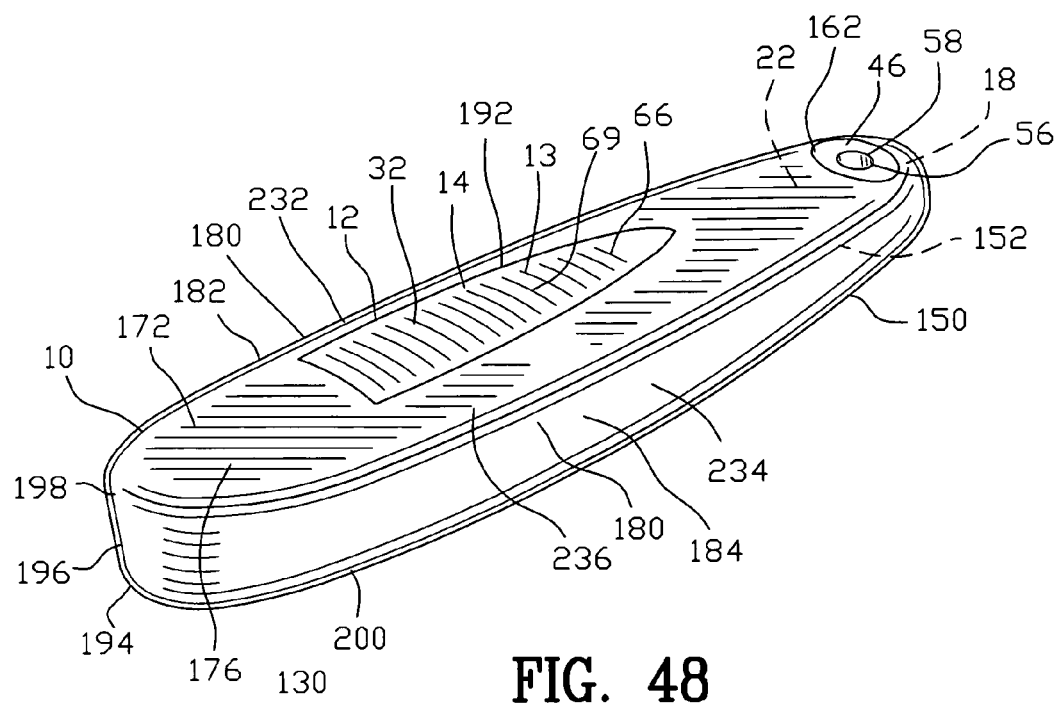
FIG. 48 is a bottom isometric view of FIG. 46.
Figure 49:
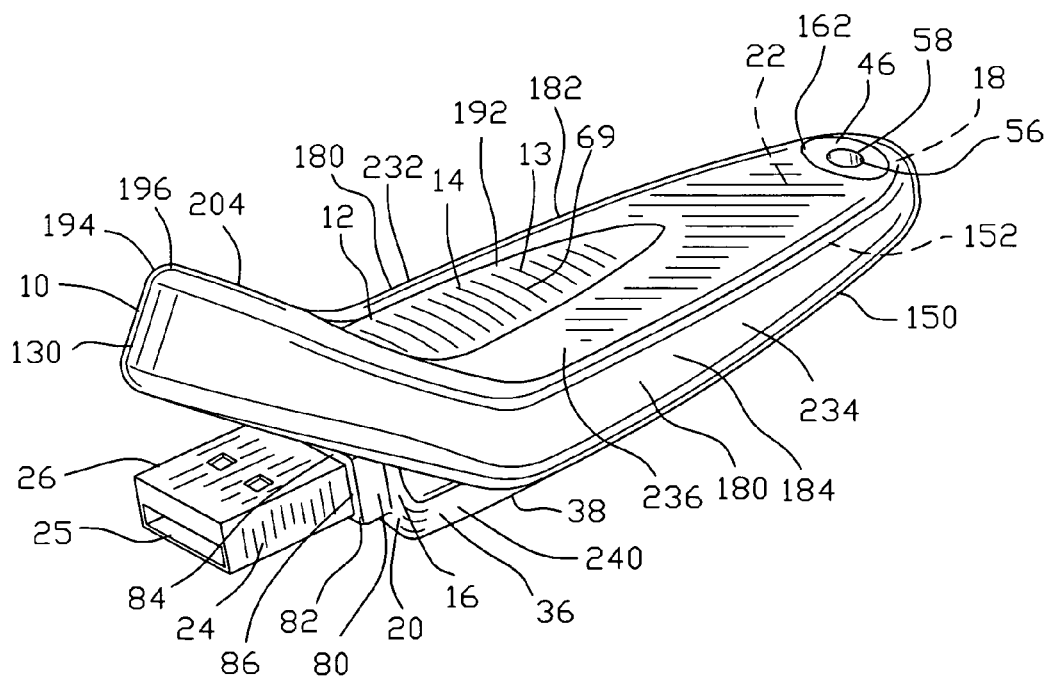
FIG. 49 is a view of FIG. 48 with the plug cap removed from the electronic device.
Figure 50:
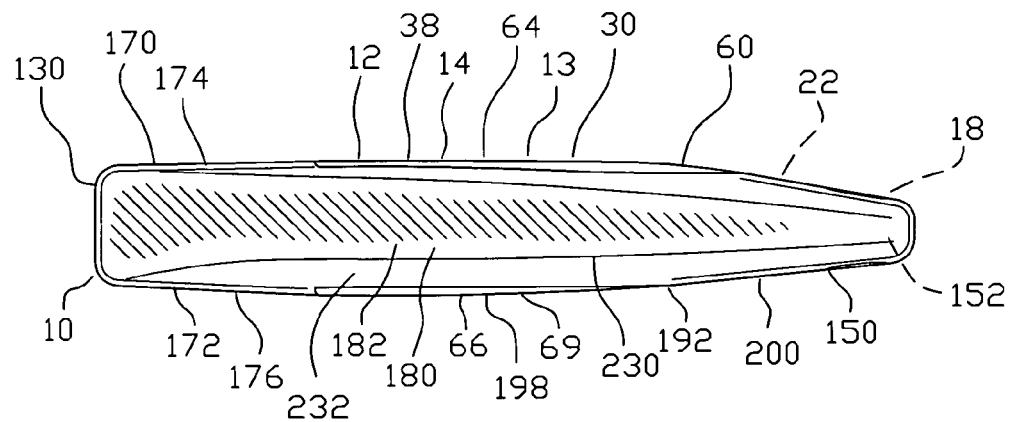
FIG. 50 is a side view of FIG. 46.
Figure 51:
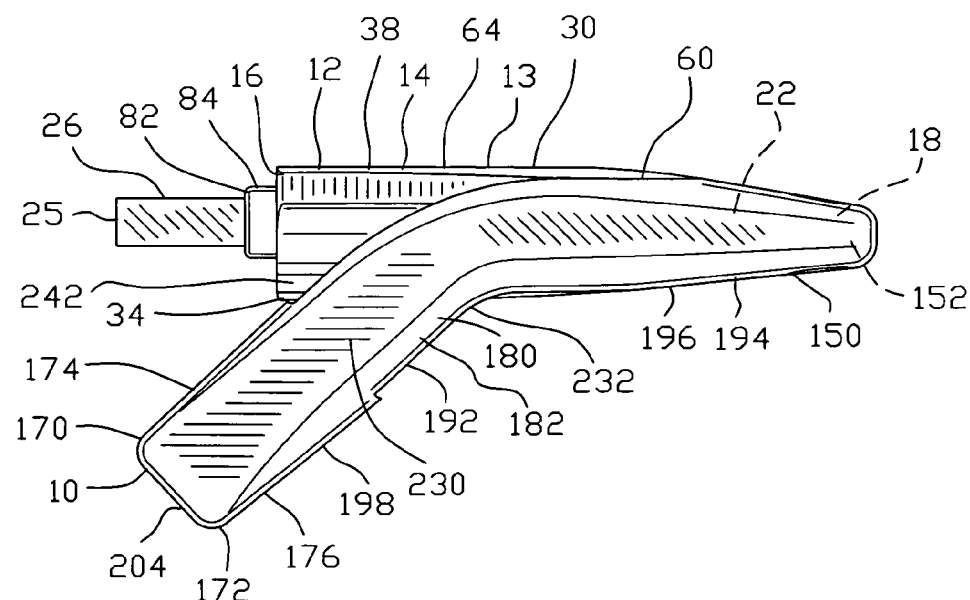
FIG. 51 is a view of FIG. 50 with the plug cap removed from the electronic device.
Figure 52:
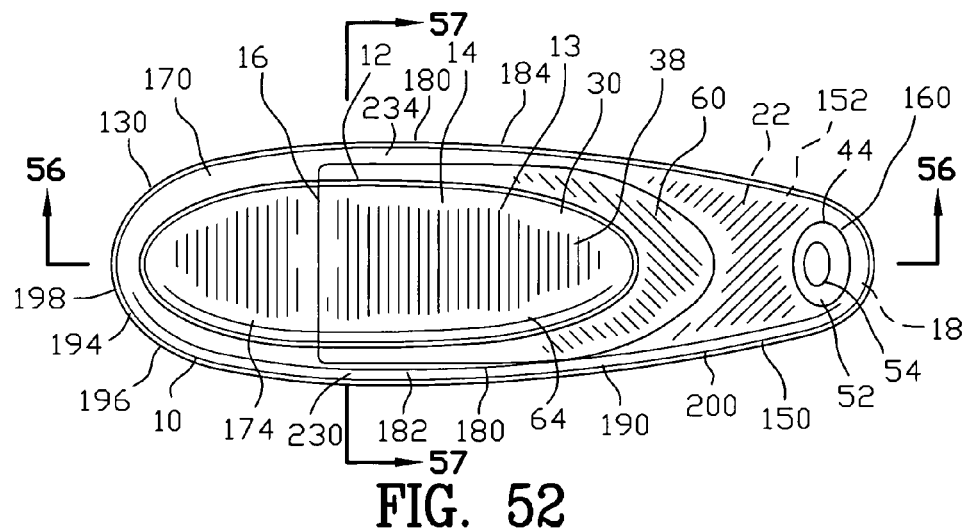
FIG. 52 is a top view of FIG. 46.
Figure 53:
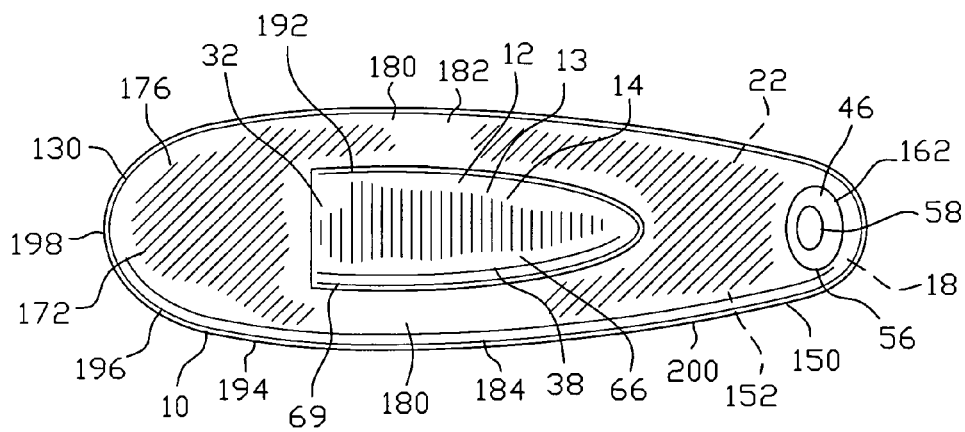
FIG. 53 is a bottom view of FIG. 46.
Figure 54:
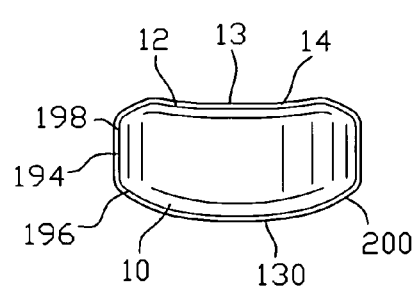
FIG. 54 is a front view of FIG. 46.
Figure 55:
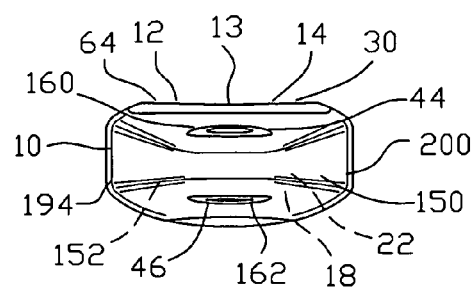
FIG. 55 is a rear view of FIG. 46.
Figure 56:
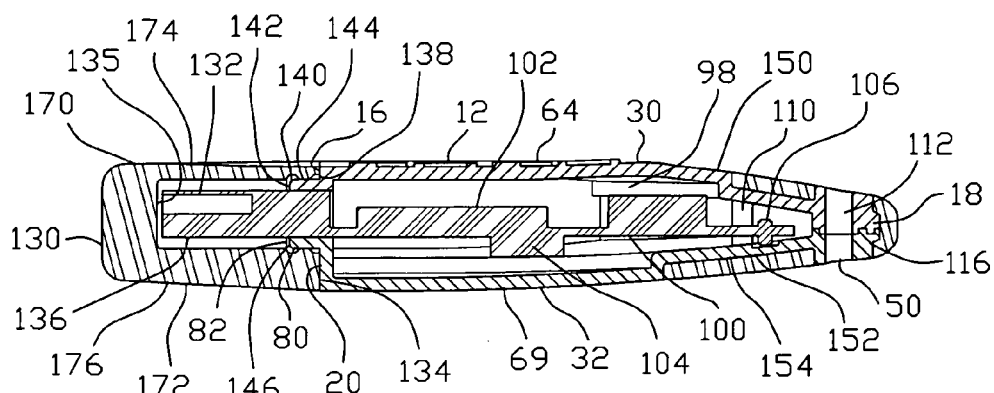
FIG. 56 is a section view along line 56-56 in FIG. 52.
Figure 57:
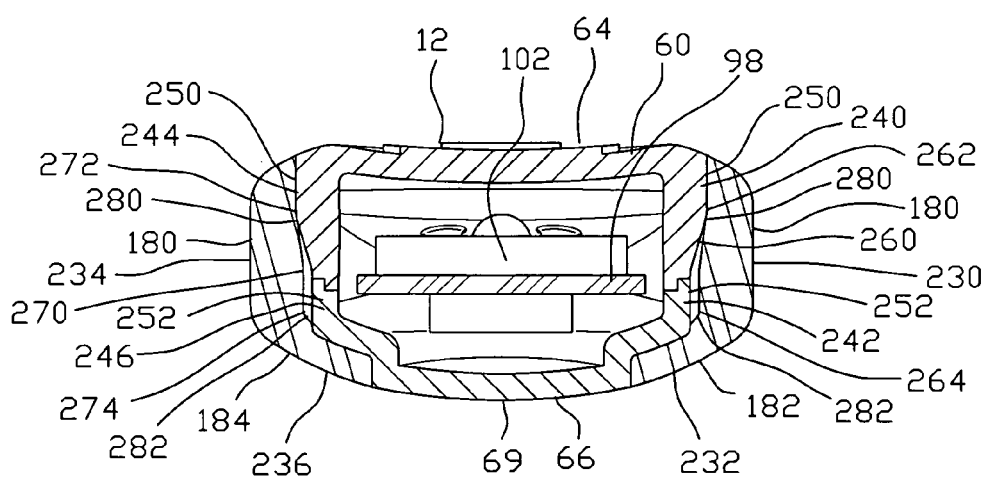
FIG. 57 is a section view along line 57-57 in FIG. 53.
Figure 59:
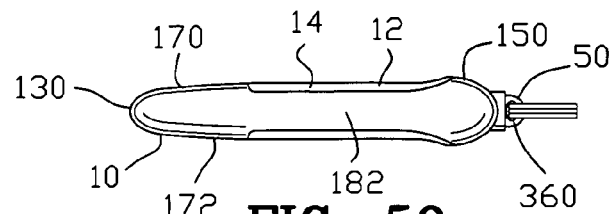
FIG. 59 is a left side view of FIG. 58.
Figures 58, 60, 61:
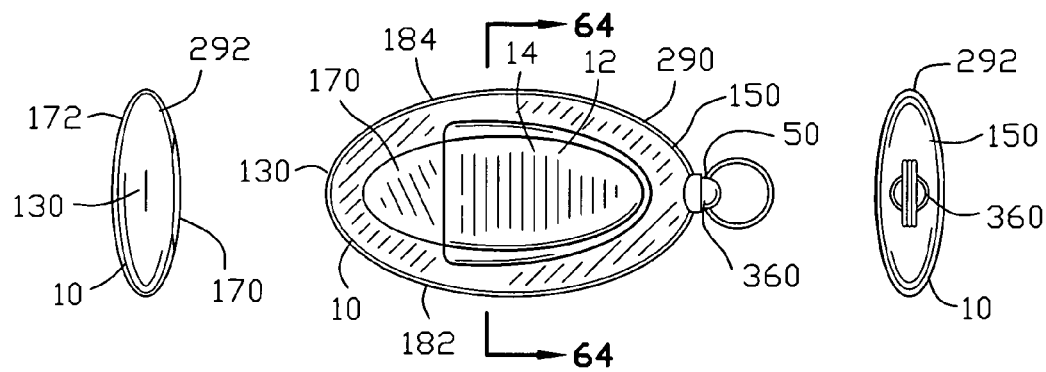
FIG. 58 is a top view of a third embodiment of an apparatus for engaging an electronic device incorporating the present invention.
FIG. 60 is a front view of FIG. 58.
FIG. 61 is a rear view of FIG. 58.
Figure 62:
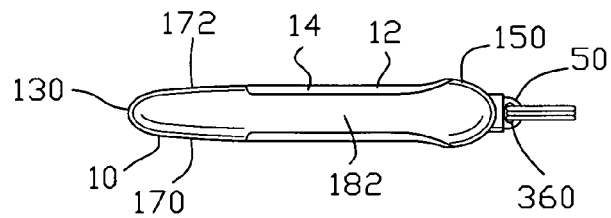
FIG. 62 is a right side view of FIG. 58.
Figure 63:
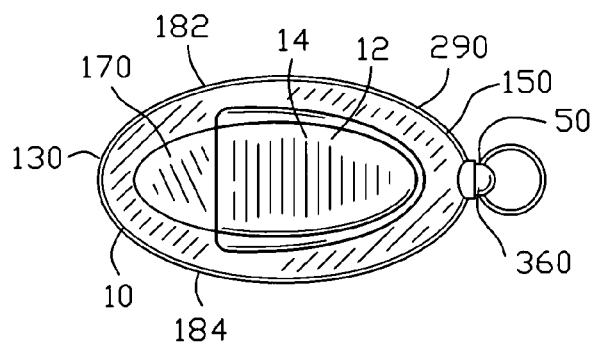
FIG. 63 is a bottom view of FIG. 58.
Figure 64:
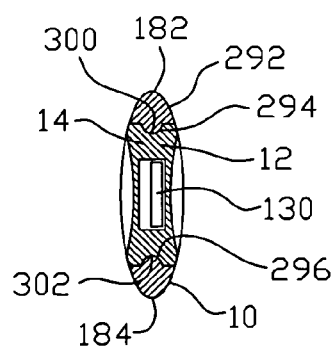
FIG. 64 is a section view along line 64-64 in FIG. 58.
Figure 66:
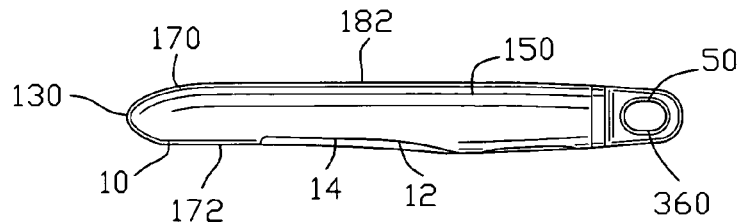
FIG. 66 is a left side view of FIG. 65.
Figures 65, 67, 68:
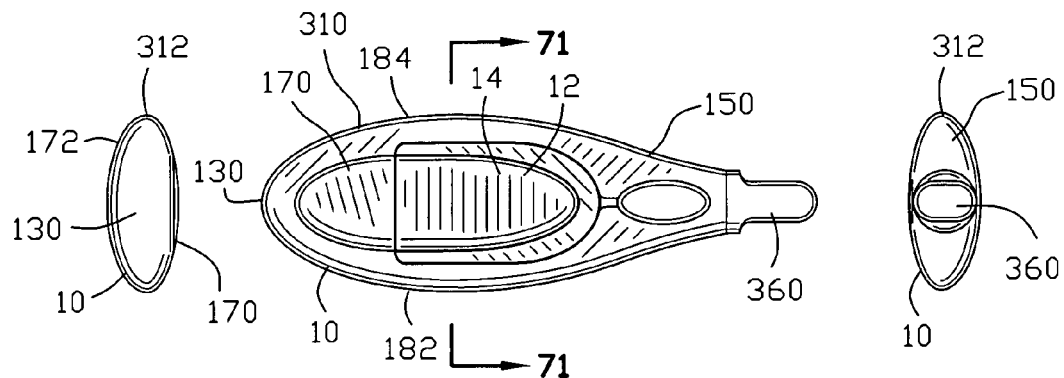
FIG. 65 is a top view of a fourth embodiment of an apparatus for engaging an electronic device incorporating the present invention.
FIG. 67 is a front view of FIG. 65.
FIG. 68 is a rear view of FIG. 65.
Figure 69:
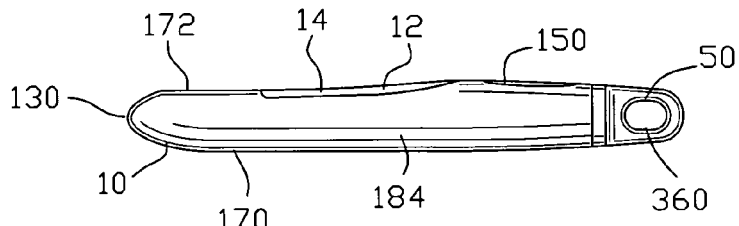
FIG. 69 is a right side view of FIG. 65.
Figure 70:
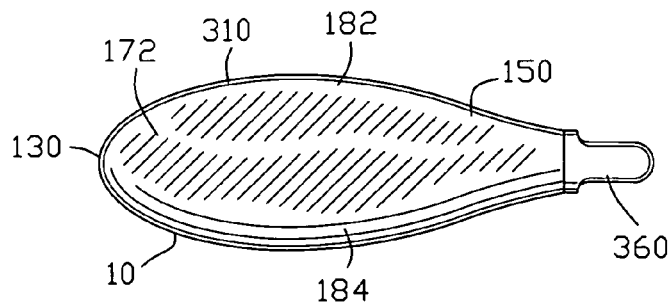
FIG. 70 is a bottom view of FIG. 65.
Figure 71:
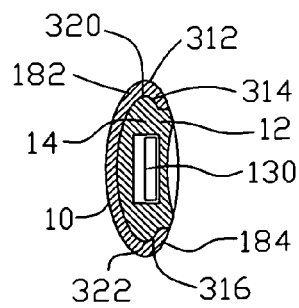
FIG. 71 is a section view along line 71-71 in FIG. 65.
Figure 86:
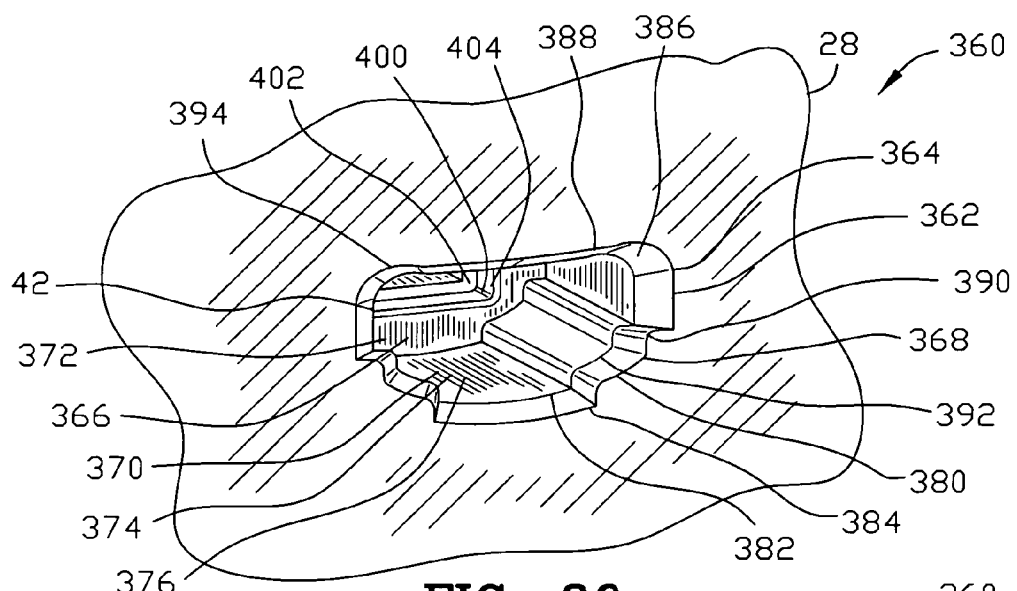
FIG. 86 is an isometric view of a coupling for joining an electronic device to a computer device incorporating the present invention.
Figure 87:
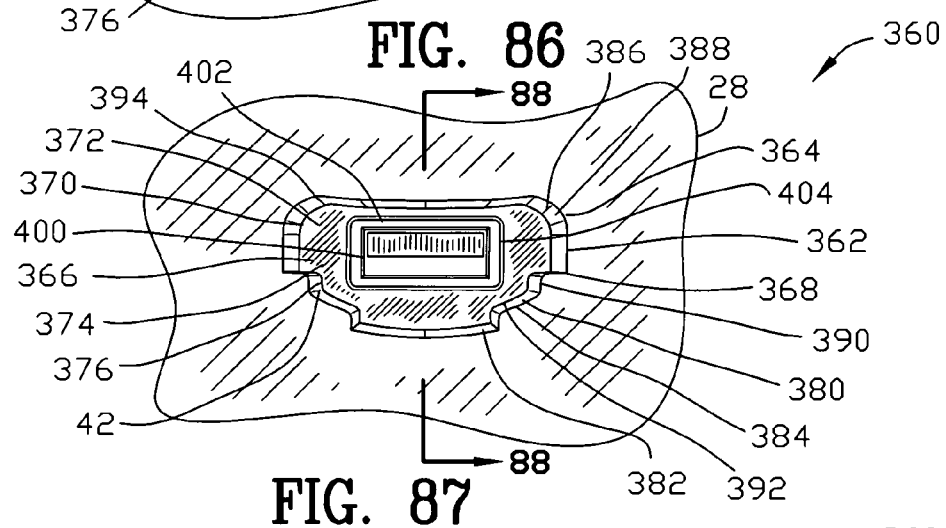
FIG. 87 is a front view of FIG. 86.
Figure 88:
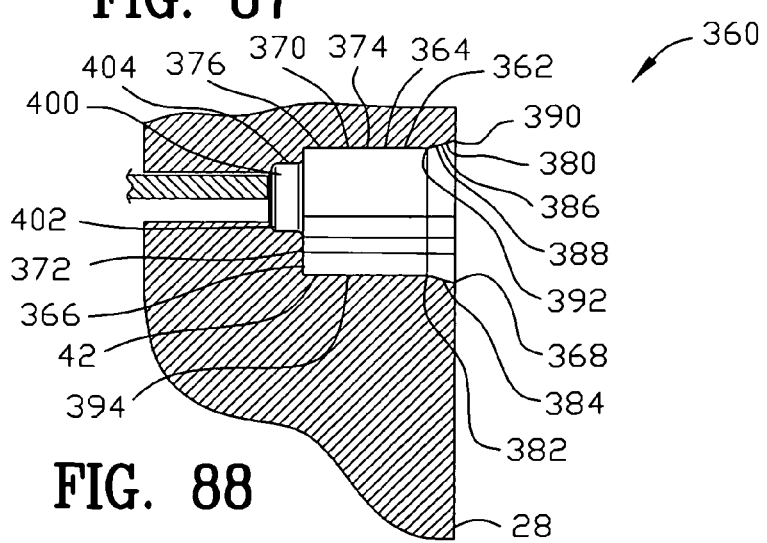
FIG. 88 is a section view along line 88-88 in FIG. 87.
Figure 89:
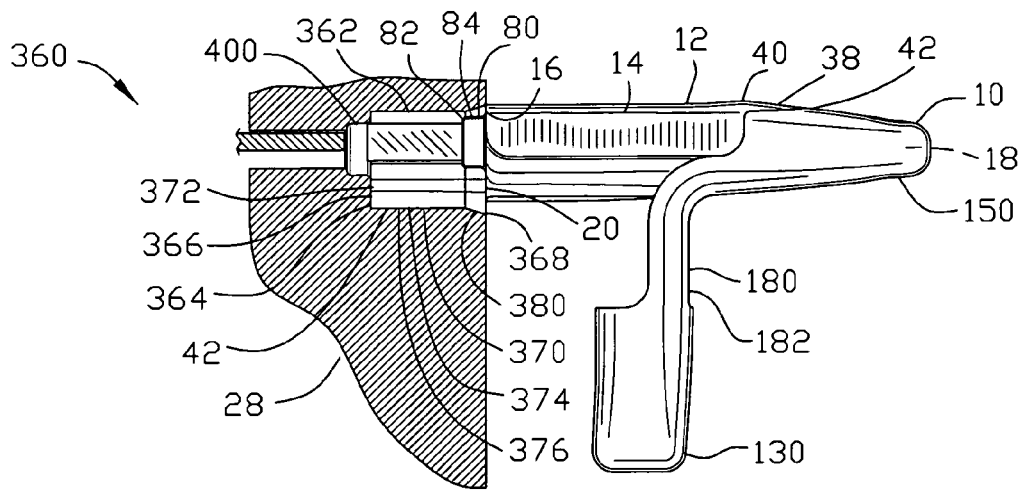
FIG. 89 is a view similar to FIG. 88 illustrating the apparatus being inserted into the coupling.
Figure 90:
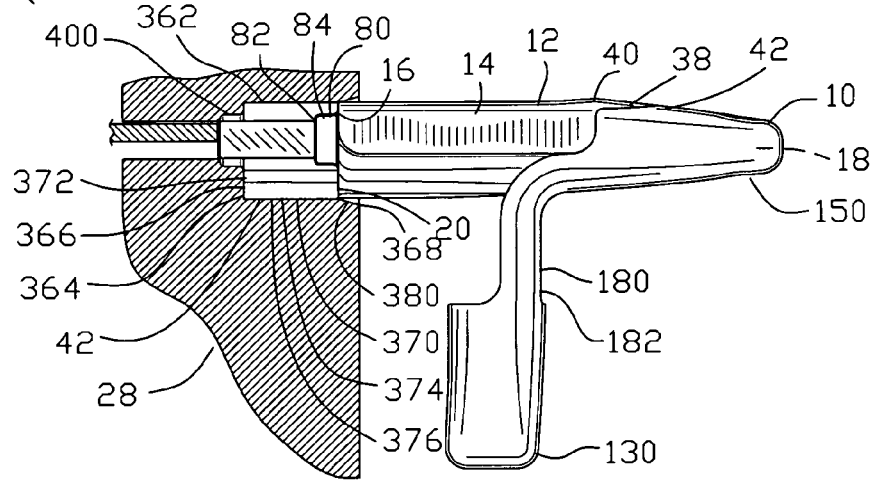
FIG. 90 is a view similar to FIG. 89 illustrating the apparatus being further inserted into the coupling.
Figure 91:
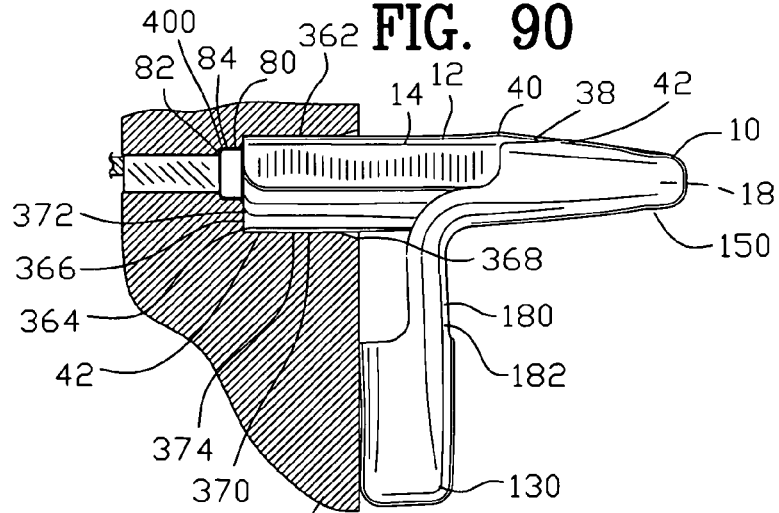
FIG. 91 is a view similar to FIG. 90 illustrating the apparatus being fully inserted into the coupling.

As seen in FIG. 44, the elastic tether 180 is deformable for providing a second length 202 during which the plug cap 130 is displaced above the plug 24 for inserting or removing the plug bore 132 from the plug 24. The operator 8 is able to seize the housing 14 without making contact with the sleeve 10 by positioning the operator's thumb 212 and index finger 214 of the operator's right hand 210 on the recessed concave portion 64 and raised convex portion 69 respectively. The operator is able to seize the plug cap 130 without making contact with the housing 14 by positioning the operator's thumb 222 and index finger 224 of the operator's left hand 220 on the cap concave portion 174 and cap convex surface 176 respectively. The operator 8 displaces the plug cap 24 from the housing 14 by applying opposing forces to the housing 14 and the plug cap 24. The elastic tether 180 expands in length to disengage the plug cap 24 from the housing 14. As seen in FIGS. 2, 4, 6, and 36-42 the elastic tether 180 is deformable for providing a third length 204 during removal of the plug cap 130 from the plug 24. The polymeric material 196 may include a high flexibility such that the plug cap 130 can be distance from the plug 24. While the plug cap 130 is removed from the housing 14, the elastic tether 180 is in a relaxed state. During the relaxed state, the third length 204 of the elastic tether 180 is less than the length of the first length 200 of the elastic tether 180 in order to provide a compressive force between the housing 14 and the plug cap 130 during the plug cap 130 engaged with the plug 24. The compressive force between the housing 14 and the plug cap 130 assures that the first cap engaging surface 138 remains adjacent to the housing engaging surface 20, the second cap engaging surface 146 remains adjacent to the finger engaging surface 20 and the input end 25 of the plug 24 remains adjacent to the cap end 135 of the plug cap 130. The direct contact between the first cap engaging surface 138 with the housing engaging surface 20, between the second cap engaging surface 146 with the finger engaging surface 20 and between the input end 25 of the plug 24 with the cap end 135 of the plug cap 130 protects the plug 24 from moisture, debris and/or damage from striking a foreign object. The engagement between the first orifice 160 with the first step 44 and between the second orifice 162 with the second step 46 prevents the sleeve 10 from being accidentally separated from the housing 14 while the plug cap 130 is removed from the housing 14.

As best seen in FIGS. 2, 4, 6, 44 and 45, when the plug cap 130 is engaged with the plug 24, a first majority portion 230 of the first elastic strand 182 is positioned adjacent to the bottom surface 32 and a first minority portion 232 of the first elastic strand 182 is positioned adjacent to the first side surface 34. Furthermore, when the plug cap 130 is engaged with the plug 24, a second majority portion 234 of the second elastic strand 182 is positioned adjacent to the bottom surface 32 and a second minority portion 236 of the first elastic strand 182 is positioned adjacent to the second side surface 36. The first and second majority portions 230 and 234 permits the plug 24 to be easily pivoted towards the bottom surface 32 of the housing 14 and hinders the plug 24 to be pivoted towards the top surface 30 of the housing 14.

FIGS. 46-57 illustrate a second embodiment of the subject invention. The second embodiment includes the first side surface 34 of the housing 14 having a first aligning rib 240 and a second aligning rib 242 extending from the housing engaging surface 20 to the housing support surface 22. The second side surface 36 of the housing 14 includes a third aligning rib 244 and a fourth aligning rib 246 extending from the housing engaging surface 20 to the housing support surface 22. The first and third aligning ribs 240 and 244 have a first contoured rib cross section 250. The second and fourth aligning ribs 242 and 246 have a second contoured rib cross section 252.

The first elastic strand 182 of the sleeve 10 includes a first interior strand surface 260 that is positioned adjacent to the first side surface 34 during the plug cap 130 being engaged with the plug 24. The first interior strand surface 260 comprises a first rib groove 262 and a second rib groove 264 extending from the plug cap 130 to the housing cap 150. The second elastic strand 184 of the sleeve 10 includes a second interior strand surface 270 that is positioned adjacent to the second side surface 36 during the plug cap 130 being engaged with the plug 24. The second interior strand surface 270 comprises a third rib groove 272 and a fourth rib groove 274 extending from the plug cap 130 to the housing cap 150. The first and third rib grooves 262 and 272 have a first contoured groove cross section 280. The second and fourth rib grooves 264 and 274 have a second contoured groove cross section 282.

The first contoured rib cross section 250 is commensurate with the first contoured groove cross section 280 for aligning and keying the first elastic strand 182 of the sleeve 10 with the first side surface 34 of the housing 14 when the plug cap 130 is engaged with the plug 24. Furthermore, the second contoured rib cross section 252 is commensurate with the second contoured groove cross section 282 for aligning and keying the second elastic strand 184 of the sleeve 10 with the first side surface 36 of the housing 14 when the plug cap 130 is engaged with the plug 24.

FIGS. 58-64 illustrate a third embodiment of the subject invention. The third embodiment includes a sleeve 10 having a first elliptical shape 290 when view from the top and a second elliptical shape 292 when viewed from the front and rear. The first side surface 34 of the housing 14 has a first recessed channel 294 extending from the housing engaging surface 20 to the housing support surface 22. The second side surface 36 of the housing 14 includes a second recessed channel 296 extending from the housing engaging surface 20 to the housing support surface 22.

The first elastic strand 182 of the sleeve 10 includes a first interior strand surface 260 that is positioned adjacent to the first side surface 34 during the plug cap 130 being engaged with the plug 24. The first interior strand surface 260 comprises a first elongated notch 300 extending from the plug cap 130 to the housing cap 150. The second elastic strand 184 of the sleeve 10 includes a second interior strand surface 270 that is positioned adjacent to the second side surface 36 during the plug cap 130 being engaged with the plug 24. The second interior strand surface 270 comprises a second elongated notch 302 from the plug cap 130 to the housing cap 150.

The first elongated notch 300 is insertable into the first recessed channel 294 for aligning and keying the first elastic strand 182 of the sleeve 10 with the first side surface 34 of the housing 14 when the plug cap 130 is engaged with the plug 24. Furthermore, the second elongated notch 302 is insertable into the second recessed channel 296 for aligning and keying the second elastic strand 184 of the sleeve 10 with the first side surface 36 of the housing 14 when the plug cap 130 is engaged with the plug 24.

FIGS. 65-71 illustrate a fourth embodiment of the subject invention. The fourth embodiment includes a sleeve 10 having a generally tear drop shape 310 when view from the top and a generally elliptical shape 312 when viewed from the front and rear. The fourth embodiment includes the first side surface 34 of the housing 14 having a first elongated ridge 314 extending from the housing engaging surface 20 to the housing support surface 22. The second side surface 36 of the housing 14 includes a second elongated ridge 316 extending from the housing engaging surface 20 to the housing support surface 22.

The first elastic strand 182 of the sleeve 10 includes a first interior strand surface 260 that is positioned adjacent to the first side surface 34 during the plug cap 130 being engaged with the plug 24. The first interior strand surface 260 comprises a first elongated duct 320 extending from the plug cap 130 to the housing cap 150. The second elastic strand 184 of the sleeve 10 includes a second interior strand surface 270 that is positioned adjacent to the second side surface 36 during the plug cap 130 being engaged with the plug 24. The second interior strand surface 270 comprises a second elongated duct 322 from the plug cap 130 to the housing cap 150.

The first elongated ridge 314 is insertable into the first elongated duct 320 for aligning and keying the first elastic strand 182 of the sleeve 10 with the first side surface 34 of the housing 14 when the plug cap 130 is engaged with the plug 24. Furthermore, the second elongated ridge 316 is insertable into the second elongated duct 322 for aligning and keying the second elastic strand 184 of the sleeve 10 with the first side surface 36 of the housing 14 when the plug cap 130 is engaged with the plug 24.

FIGS. 72-78 illustrate a fifth embodiment of the subject invention. The fifth embodiment includes a sleeve 10 having a generally elliptical shape 330 when view from the top and a generally elliptical shape 332 when viewed from the front and rear. The fifth embodiment includes the first side surface 34 of the housing 14 having a first elongated ridge 334 extending from the housing engaging surface 20 to the housing support surface 22. The second side surface 36 of the housing 14 includes a second elongated ridge 336 extending from the housing engaging surface 20 to the housing support surface 22.

The first elastic strand 182 of the sleeve 10 includes a first interior strand surface 260 that is positioned adjacent to the first side surface 34 during the plug cap 130 being engaged with the plug 24. The first interior strand surface 260 comprises a first elongated duct 340 extending from the plug cap 130 to the housing cap 150. The second elastic strand 184 of the sleeve 10 includes a second interior strand surface 270 that is positioned adjacent to the second side surface 36 during the plug cap 130 being engaged with the plug 24. The second interior strand surface 270 comprises a second elongated duct 342 from the plug cap 130 to the housing cap 150.

The first elongated ridge 334 is insertable into the first elongated duct 340 for aligning and keying the first elastic strand 182 of the sleeve 10 with the first side surface 34 of the housing 14 when the plug cap 130 is engaged with the plug 24. Furthermore, the second elongated ridge 336 is insertable into the second elongated duct 342 for aligning and keying the second elastic strand 184 of the sleeve 10 with the first side surface 36 of the housing 14 when the plug cap 130 is engaged with the plug 24.

FIGS. 79-85 illustrate a sixth embodiment of the subject invention. The sixth embodiment includes a sleeve 10 having a generally elliptical shape 330 when view from the top and a generally elliptical shape 332 when viewed from the front and rear. The sixth embodiment includes the first side surface 34 of the housing 14 having a first elongated generally S-shaped groove 350 extending from the housing engaging surface 20 to the housing support surface 22. The second side surface 36 of the housing 14 includes a second elongated generally S-shaped groove 352 extending from the housing engaging surface 20 to the housing support surface 22.

The first elastic strand 182 of the sleeve 10 includes a first interior strand surface 260 that is positioned adjacent to the first side surface 34 during the plug cap 130 being engaged with the plug 24. The first interior strand surface 260 comprises a first elongated generally inverted S-shaped groove 354 extending from the plug cap 130 to the housing cap 150. The second elastic strand 184 of the sleeve 10 includes a second interior strand surface 270 that is positioned adjacent to the second side surface 36 during the plug cap 130 being engaged with the plug 24. The second interior strand surface 270 comprises a second elongated generally inverted S-shaped groove 356 from the plug cap 130 to the housing cap 150.

The first elongated generally S-shaped groove 350 is insertable into the first elongated generally inverted S-shaped groove 354 for aligning and keying the first elastic strand 182 of the sleeve 10 with the first side surface 34 of the housing 14 when the plug cap 130 is engaged with the plug 24. Furthermore, the second elongated generally S-shaped groove 352 is insertable into the second elongated generally inverted S-shaped groove 356 for aligning and keying the second elastic strand 184 of the sleeve 10 with the first side surface 36 of the housing 14 when the plug cap 130 is engaged with the plug 24.

FIGS. 86-91 are various views of a coupling 360 for joining the electronic device 12 with the computer device 28. The computer device 28 includes a plug receiver 362 for engaging the plug 24 for transferring data between the electronic device 12 and the computer device 28.

The coupling 360 couples the housing 14 of the electronic device 12 to a receptacle 364. The receptacle 364 comprises an interior end 366, an exterior end 368 and a wall surface 370. The interior end 366 defines a receptacle engaging surface 372 for receiving the housing engaging surface 20. The wall surface 370 defines a contoured wall cross section 374. The contoured body cross section 40 of the housing 14 is commensurate with the contoured wall cross section 374 for inserting and keying the housing 14 into the receptacle 364. Preferably, the contoured body cross section 40 of the body 38 and the contoured wall cross section 374 of the receptacle 364 have a non-symmetrical cross section 42 for permitting inserting and keying of the housing 14 into the receptacle 364 in only one orientation.

The exterior end 368 of the receptacle 364 includes a guide 380 having an interior aperture 382, an exterior aperture 384 and a tapered surface 386 positioned therebetween. The tapered surface 386 may include a conical surface 388 positioned between the interior aperture 382 and the exterior aperture 384.

The interior aperture 382 of the guide 380 is positioned within the wall surface 370. The exterior aperture 384 of the guide 380 is positioned at the exterior end 368 of the receptacle 364. The exterior aperture 384 includes a first contoured guide cross section 390 and the interior aperture 382 includes a second contoured guide cross section 392. The first contoured guide cross section 390 is larger than the second contoured guide cross section 392 for tapering the conical surface 388 from the exterior end 368 to the wall surface 370 for directing the housing 14 into the receptacle 364. Preferably, the shape of the first contoured guide cross section 390 is the similar to the shape of the contoured body cross section 40, however, the overall size of the first contoured guide cross section 390 is larger than the contoured body cross section 40 for inserting and keying the housing 14 into the 364 receptacle. Furthermore, the second contoured guide cross section 392 is preferably commensurate with the contoured body cross section 40 of the body 38. The guide 380 and the housing 14 may be constructed from an integral one piece unit 394.

A finger receptacle 400 extends from the receptacle engaging surface 372 of the receptacle 364 to a finger supporting surface 402 for receiving the finger 80 of the electronic device 12. The finger receptacle 400 defines a contoured finger receptacle cross section 404. Preferably, the contoured finger cross section 84 is commensurate with the contoured finger receptacle cross section 404 for inserting and keying the housing 14 into the receptacle 364.

The distance between the housing engaging surface 20 and the finger engaging surface 82 is commensurate with the distance between the receptacle engaging surface 372 and the finger supporting surface 402 to allow simultaneous engagement of the receptacle engaging surface 372 with the housing engaging surface 20 and the finger supporting surface 402 with the finger engaging surface 82. Preferably, both the finger 80 and housing 14 are an integral one piece unit and the finger receptacle and the receptacle are an integral one piece unit.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A sleeve for engaging an electronic device, the electronic device having a housing, the housing including a first end and a second end, the first end of the housing defining a housing engaging surface, the second end of the housing defining a housing support surface, a plug extending from the housing engaging surface of the housing and the plug engaging a computer device for transferring data between the electronic device and the computer device, the sleeve, comprising:

a plug cap having a bore and a cap rim;

said bore defining a bore surface for receiving the plug;

said cap rim defining a cap engaging surface for positioning adjacent to the housing engaging surface of the housing;

a housing cap having a cavity;

said cavity defining a cavity surface for receiving the housing support surface of the housing;

an elastic tether extending between said plug cap and said housing cap for securing said plug cap to said housing cap;

said elastic tether being deformable for providing a first length during said plug cap engaging the plug for retaining said cap engaging surface adjacent to the housing engaging surface of the housing for sealing said plug;

said elastic tether being deformable for providing a second length during said plug cap displacing above the plug for inserting or removing said plug bore from said plug; and said elastic tether being deformable for providing a third length during removal of said plug cap from the plug for retaining said plug cap to the electronic storage device.

2. A sleeve for engaging an electronic device as set forth in claim 1, wherein the housing includes a top surface and a bottom surface;

a first step extending above the top surface of said housing;

said housing cap having a first orifice engaging said first step for preventing movement of said housing cap relative to the housing during removal of said plug cap from the plug.

3. A sleeve for engaging an electronic device as set forth in claim 1, wherein the housing includes a top surface and a bottom surface;

a second step extending above the bottom surface of said housing;

said housing cap having a second orifice engaging said second step for preventing movement of said housing cap relative to the housing during removal of said plug cap from the plug.

4. A sleeve for engaging an electronic device as set forth in claim 1, wherein the housing includes a top surface and a bottom surface;

a first step extending above the top surface of said housing;

a second step extending above the bottom surface of said housing;

said housing cap having a first orifice engaging said first step and a second orifice engaging said second step for preventing movement of said housing cap relative to the housing during removal of said plug cap from the plug.

5. A sleeve for engaging an electronic device as set forth in claim 1, wherein the housing includes a top surface and a bottom surface;

a passage positioned at the second end of the housing and traversing from the top surface to the bottom surface;

a first orifice positioned on said housing cap for aligning with said passage on said top surface; and a second orifice positioned on said housing cap for aligning with said passage on said bottom surface.

6. A sleeve for engaging an electronic device as set forth in claim 1, wherein the housing includes a top surface and a bottom surface;

a passage positioned at the second end of the housing and traversing from the top surface to the bottom surface;

a first step extending above the top surface of said housing and positioned adjacent to said passage;

a second step extending above the bottom surface of said housing and positioned adjacent to said passage;

a first orifice positioned on said housing cap engaging said first step for preventing movement of said housing cap relative to the housing during removal of said plug cap from the plug; and a second orifice positioned on said housing cap engaging said second step for preventing movement of said housing cap relative to the housing during removal of said plug cap from the plug.

7. A sleeve for engaging an electronic device as set forth in claim 1, wherein said plug cap, said housing cap and said elastic tether are an integral one piece unit.

8. A sleeve for engaging an electronic device as set forth in claim 1, wherein said plug cap, said housing cap and said elastic tether are an integral one piece unit; and said plug cap, said housing cap and said elastic tether including a polymeric material.

9. A sleeve for engaging an electronic device as set forth in claim 1, wherein said plug cap, said housing cap and said elastic tether are an integral one piece unit; and said plug cap, said housing cap and said elastic tether including a translucent polymeric material.

10. A sleeve for engaging an electronic device as set forth in claim 1, wherein said elastic tether includes a first elastic strand and a second elastic strand extending between said plug cap and said housing cap for securing said plug cap to said housing cap.

11. A sleeve for engaging an electronic device as set forth in claim 1, wherein said elastic tether includes a first elastic strand and a second elastic strand extending between said plug cap and said housing cap for securing said plug cap to said housing cap; and a slot defined between said first elastic strand and said second elastic strand for exposing the housing.

12. A sleeve for engaging an electronic device as set forth in claim 1, wherein the housing includes a top surface, a bottom surface, a first side surface and a second side surface;

said elastic tether including a first elastic strand extending between said plug cap and said housing cap and positioning said first elastic strand adjacent to the first side surface of the housing;

said elastic tether including a second elastic strand extending between said plug cap and said housing cap and positioning said second elastic strand adjacent to the second side surface of the housing; and a slot defined between said first elastic strand and said second elastic strand for exposing the top surface and bottom surface of the housing.

13. A sleeve for engaging an electronic device as set forth in claim 1, wherein the housing includes a top surface, a bottom surface, a first side surface and a second side surface;

said elastic tether including a first elastic strand extending between said plug cap and said housing cap and positioning said first elastic strand adjacent to the bottom surface and the first side surface of the housing;

said elastic tether including a second elastic strand extending between said plug cap and said housing cap and positioning said second elastic strand adjacent to the bottom surface and second side surface of the housing; and a slot defined between said first elastic strand and said second elastic strand for exposing the top surface and bottom surface of the housing.

14. A sleeve for engaging an electronic storage device, the electronic storage device having a housing, the housing including a first end and a second end, the first end of the housing defining a housing engaging surface, the second end of the housing defining a housing support surface, the housing containing a portable memory, a plug extending from the housing engaging surface of the housing and electrically communicating with the portable memory, the plug engaging a computer device for transferring data between the electronic storage device and the computer device, the sleeve, comprising:

a plug cap having a bore and a cap rim;

said bore defining a bore surface for receiving the plug;

said cap rim defining a cap engaging surface for positioning adjacent to the housing engaging surface of the housing;

a housing cap having a cavity;

said cavity defining a cavity surface for receiving the housing support surface of the housing;

an elastic tether extending between said plug cap and said housing cap for securing said plug cap to said housing cap;

said elastic tether being deformable for providing a first length during said plug cap engaging the plug for retaining said cap engaging surface adjacent to the housing engaging surface of the housing for sealing said plug;

said elastic tether being deformable for providing a second length during said plug cap displacing above the plug for inserting or removing said plug bore from said plug; and said elastic tether being deformable for providing a third length during removal of said plug cap from the plug for retaining said plug cap to the electronic storage device.

15. A sleeve for engaging an electronic storage device, the electronic storage device having a housing, the housing including a first end and a second end, the first end of the housing defining a housing engaging surface, the second end of the housing defining a housing support surface, the housing containing an portable memory, a plug extending from the housing engaging surface of the housing and electrically communicating with the portable memory, the plug engaging a computer device for transferring data between the electronic storage device and the computer device, the sleeve, comprising:

a plug cap having a bore and a cap rim;

said bore defining a bore surface for receiving the plug;

said cap rim defining a cap engaging surface for positioning adjacent to the housing engaging surface of the housing;

a housing cap having a cavity;

said cavity defining a cavity surface for receiving the housing support surface of the housing;

an elastic tether extending between said plug cap and said housing cap for securing said plug cap to said housing cap;

said elastic tether being deformable for providing a first length during said plug cap engaging the plug for retaining said cap engaging surface adjacent to the housing engaging surface of the housing for sealing said plug;

said elastic tether being deformable for providing a second length during said plug cap displacing above the plug for inserting or removing said plug bore from said plug;

said elastic tether being deformable for providing a third length during removal of said plug cap from the plug for retaining said plug cap to the electronic storage device;

said elastic tether including a first elastic strand and a second elastic strand extending between said plug cap and said housing cap for securing said plug cap to said housing cap; and a slot defined between said first elastic strand and said second elastic strand for exposing the housing.

* * * * *